(12) United States Patent
Lee et al.

(10) Patent No.: US 10,424,672 B2
(45) Date of Patent: Sep. 24, 2019

(54) OXIDE SEMICONDUCTOR TRANSISTOR

(71) Applicant: SILICON DISPLAY TECHNOLOGY, Yongin-si (KR)

(72) Inventors: Suhui Lee, Seoul (KR); Sung-ryong Moon, Goyang-si (KR); Jaemin Kim, Gyeongsan-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 0 days.

(21) Appl. No.: 15/435,372

(22) Filed: Feb. 17, 2017

(65) Prior Publication Data

US 2017/0243978 A1  Aug. 24, 2017

(30) Foreign Application Priority Data

Feb. 19, 2016 (KR) .................. 10-2016-0019964
Mar. 11, 2016 (KR) .................. 10-2016-0029782

(51) Int. Cl.
| | | |
|---|---|---|
| *H01L 29/786* | (2006.01) | |
| *H01L 23/535* | (2006.01) | |
| *H01L 29/423* | (2006.01) | |
| *H01L 29/06* | (2006.01) | |
| *H01L 29/24* | (2006.01) | |
| *H01L 29/417* | (2006.01) | |

(52) U.S. Cl.
CPC ........ *H01L 29/7869* (2013.01); *H01L 23/535* (2013.01); *H01L 29/0649* (2013.01); *H01L 29/24* (2013.01); *H01L 29/41733* (2013.01); *H01L 29/42384* (2013.01)

(58) Field of Classification Search
CPC .............. H01L 23/535; H01L 29/7869; H01L 29/0649; H01L 29/24; H01L 29/41733; H01L 29/42384
See application file for complete search history.

(56) References Cited

U.S. PATENT DOCUMENTS

| | | | | |
|---|---|---|---|---|
| 6,084,248 A | * | 7/2000 | Inoue | ............... H01L 29/78696 257/66 |
| 7,115,903 B2 | * | 10/2006 | Isobe | .................. B23K 26/032 257/59 |
| 2003/0209710 A1 | * | 11/2003 | Yamazaki | ............... H01L 27/12 257/66 |
| 2007/0257260 A1 | * | 11/2007 | Liu | .................. H01L 29/78696 257/59 |

(Continued)

FOREIGN PATENT DOCUMENTS

| | | |
|---|---|---|
| JP | 2007-288080 | 11/2007 |
| JP | 5252877 | 6/2008 |

(Continued)

*Primary Examiner* — Galina G Yushina
(74) *Attorney, Agent, or Firm* — Lex IP Meister, PLLC

(57) ABSTRACT

An oxide semiconductor transistor according to an exemplary embodiment of the present invention includes: a substrate; a first gate electrode disposed on the substrate; a gate insulating layer disposed on the substrate and the first gate electrode; an oxide semiconductor layer disposed on the gate insulating layer; an etch stopper layer disposed on the oxide semiconductor layer; and a source electrode and a drain electrode disposed on the oxide semiconductor layer and the etch stopper layer and spaced apart from each other.

13 Claims, 48 Drawing Sheets

(56) References Cited

U.S. PATENT DOCUMENTS

| | | | |
|---|---|---|---|
| 2011/0193076 A1* | 8/2011 | Yun | H01L 27/1214 |
| | | | 257/43 |
| 2015/0194530 A1* | 7/2015 | Kim | H01L 29/78696 |
| | | | 257/43 |
| 2016/0093643 A1* | 3/2016 | Jang | H01L 29/78648 |
| | | | 257/43 |
| 2017/0047003 A1* | 2/2017 | Kim | G09G 3/3233 |

FOREIGN PATENT DOCUMENTS

| | | |
|---|---|---|
| JP | 2010-182819 | 8/2010 |
| KR | 10-2011-0110021 | 10/2011 |
| KR | 10-2015-0060034 | 6/2015 |

\* cited by examiner

<STD TFTs>

<Split TFTs>

<Spacing = 1.5μm>

<Fixed Unit Width = 3μm>

OXIDE SEMICONDUCTOR TRANSISTOR

CROSS-REFERENCE TO RELATED APPLICATION

This application claims priority to and the benefit of Korean Patent Application No. 10-2016-0019964 and 10-2016-0029782 filed in the Korean Intellectual Property Office on Feb. 19, 2016 and Mar. 11, 2016, the entire contents of which are incorporated herein by reference.

BACKGROUND OF THE INVENTION (a) Field of the Invention

An oxide semiconductor transistor that can be used in a pixel of a display device is provided.

(b) Description of the Related Art

Recently, research and development of a display device that is driven by a driving element using a-indium gallium zinc oxide (IGZO), which is an oxide semiconductor, have rapidly proceeded. Also, stability not only in driving of a display element but also according to mobility and a voltage current has been considerably researched and studied.

In this regard, a conventional display device driven by a driving element that uses existing a-Si is mainly used, but a driving element based on poly-Si has been applied to a display device. Since the poly-Si-based display device has high reliability due to current and strong voltage as well as high mobility, it is currently used in many products.

However, a conventional poly-Si-based semiconductor thin film transistor can provide a high performance characteristic only when using ELA crystallization, and the ELA equipment has problems of high unit production cost and maintenance cost.

Accordingly, an oxide semiconductor that can replace the semiconductor thin film transistor has been actively researched and studied. In this regard, recently, a display device that adopts a-IGZO, which is an oxide semiconductor, has been researched and developed, but mobility of the display device is as low as 10 $cm^2/Vs$ or less, and it is unstable in terms of positive bias temperature stress (PBTS) and high current temperature stress (HCTS), which are reliability factors of an oxide semiconductor thin film transistor.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention may provide an oxide semiconductor transistor that can be used as a pixel element of a display device, and that is capable of improving reliability with respect to high mobility and a high current.

In addition, an exemplary embodiment of the present invention may provide a method for manufacturing the oxide semiconductor transistor with a low cost and a simple process.

An oxide semiconductor transistor according to an exemplary embodiment of the present invention includes: a substrate; a first gate electrode disposed on the substrate; a gate insulating layer disposed on the substrate and the first gate electrode; an oxide semiconductor layer disposed on the gate insulating layer; an etch stopper layer disposed on the oxide semiconductor layer; and a source electrode and a drain electrode disposed on the oxide semiconductor layer and the etch stopper layer and spaced apart from each other.

The oxide semiconductor layer and the etch stopper layer are formed in a width direction of the first gate electrode and include a plurality of island patterns that are spaced apart from each other in a direction that is perpendicular to the width direction of the first gate electrode.

A width of the island pattern of the etch stopper layer may be smaller than or equal to a width of the island pattern of the oxide semiconductor layer.

A width of the each island pattern may be about 1 μm to about 10 μm.

A spacing distance between the respective island patterns may be about 1 μm to about 5 μm.

A number of island patterns may be about 2 to about 50.

The plurality of island patterns may be parallel with each other.

The etch stopper layer may include at least one of $SiO_2$, $Al_2O_3$, and $SiN_x$.

The oxide semiconductor layer may include at least one of an indium gallium zinc oxide (IGZO), a zinc oxide (ZnO), an indium zinc oxide (IZO), an indium tin oxide (ITO), a zinc tin oxide (ZTO), a gallium zinc oxide (GZO), a hafnium indium zinc oxide (HIZO), a zinc indium tin oxide (ZITO), and an aluminum zinc tin oxide (AZTO).

The oxide semiconductor transistor may further include a passivation layer that covers the source electrode, the drain electrode, and the etch stopper layer, and a second gate electrode disposed on the passivation layer.

The first gate electrode and the second gate electrode may be electrically connected with a via hole.

The first gate electrode and the second gate electrode may be overlapped with each other.

A cross-sectional width of the second gate electrode may be shorter than a distance between the source electrode and the drain electrode.

A distance between the second gate electrode and the source electrode may be about 0.5 μm to about 5 μm, and a distance between the second gate electrode and the drain electrode may be about 0.5 μm to about 5 μm.

An oxide semiconductor transistor according to another exemplary embodiment of the present invention includes: a substrate; an insulating layer disposed on the substrate; an oxide semiconductor layer disposed on the insulating layer; an etch stopper layer disposed on the oxide semiconductor layer; a source electrode and a drain electrode disposed on the oxide semiconductor layer and the etch stopper layer and disposed apart from each other; a gate insulating layer that covers the source electrode, the drain electrode, and the etch stopper layer; and a gate electrode disposed on the gate insulating layer.

The oxide semiconductor layer and the etch stopper layer are formed in a width direction of the gate electrode and include a plurality of island patterns that are spaced apart from each other in a direction that is perpendicular to the width direction of the gate electrode.

A cross-sectional width of the gate electrode may be shorter than a distance between the source electrode and the drain electrode.

A width of each island pattern may be about 1 μm to about 10 μm.

A spacing distance between the respective island patterns may be about 1 μm to about 5 μm.

A number of island patterns may be about 2 to about 50.

The plurality of island patterns may be parallel with each other.

The oxide semiconductor transistor according to the exemplary embodiments of the present invention can improve reliability with respect to high mobility, PBTS, and HOTS.

DETAILED DESCRIPTION OF THE EMBODIMENTS

Figure 1:
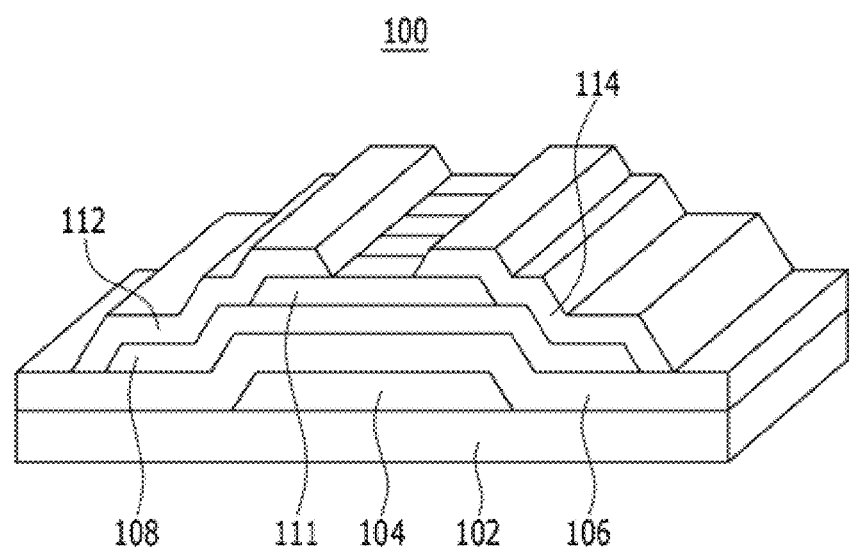
FIG. 1 is a perspective view of an oxide semiconductor transistor according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. In describing the present invention, parts that are not related to the description will be omitted in the drawings. Like reference numerals generally designate like elements throughout the specification. In addition, detailed description of widely known technologies will be omitted.

In addition, unless explicitly described to the contrary, the word "comprise" and variations such as "comprises" or "comprising" will be understood to imply the inclusion of stated elements but not the exclusion of any other elements.

As shown in FIG. 1, an oxide semiconductor transistor 100 according to an exemplary embodiment of the present invention includes a substrate 102, a first gate electrode 104, a gate insulation layer 106, an oxide semiconductor layer 108, an etch stopper layer 111, a source electrode 112, and a drain electrode 114.

The oxide semiconductor transistor 100 according to the present exemplary embodiment may be provided as a thin film transistor (TFT).

The substrate 102 according to the present exemplary embodiment may be made of glass, plastic, quartz, and the like.

The first gate electrode 104 of the present exemplary embodiment is provided on the substrate 102 and may have a constant area. The first gate electrode 104 may include a metallic material, and for example, may include molybdenum (Mo).

The oxide semiconductor transistor 100 includes the first gate electrode 104, the gate insulating layer 106, the oxide semiconductor layer 108, and the etch stopper layer 111 that are sequentially stacked.

The gate insulating layer 106 may include an oxide or a metal oxide, and for example, may include a silicon oxide ($SiO_x$).

The oxide semiconductor layer 108 is provided on the gate insulating layer 106. The oxide semiconductor layer 108 may include indium (In), and may include at least one of an indium gallium zinc oxide (IGZO), a zinc oxide (ZnO), an indium zinc oxide (IZO), an indium tin oxide (ITO), a zinc tin oxide (ZTO), a gallium zinc oxide (GZO), a hafnium indium zinc oxide (HIZO), a zinc indium tin oxide (ZITO), and an aluminum zinc tin oxide (AZTO).

Figure 2A:
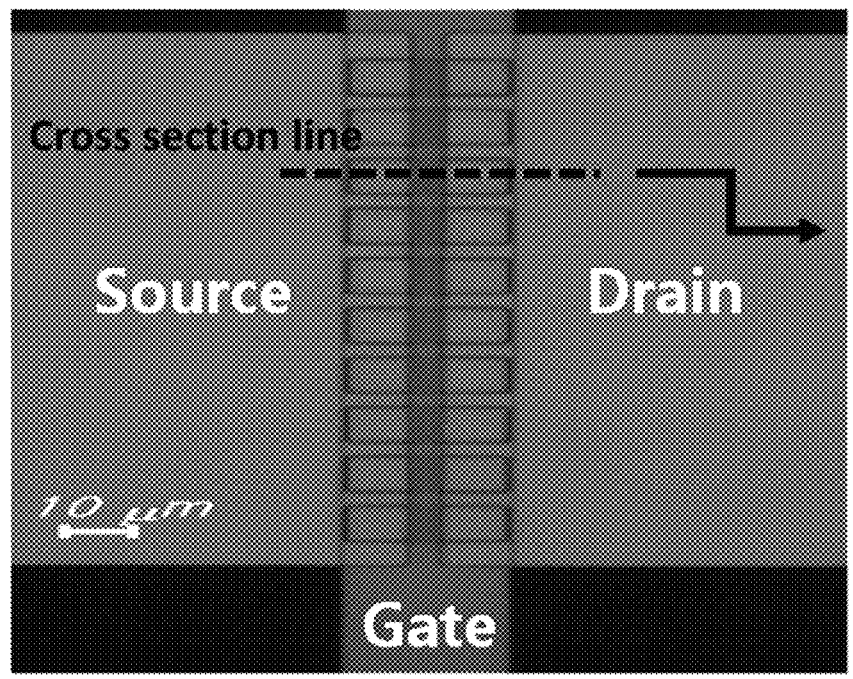
FIG. 2A to FIG. 2D show cross-sectional views of the oxide semiconductor transistor according to the exemplary embodiment of the present invention.
Figure 2B:
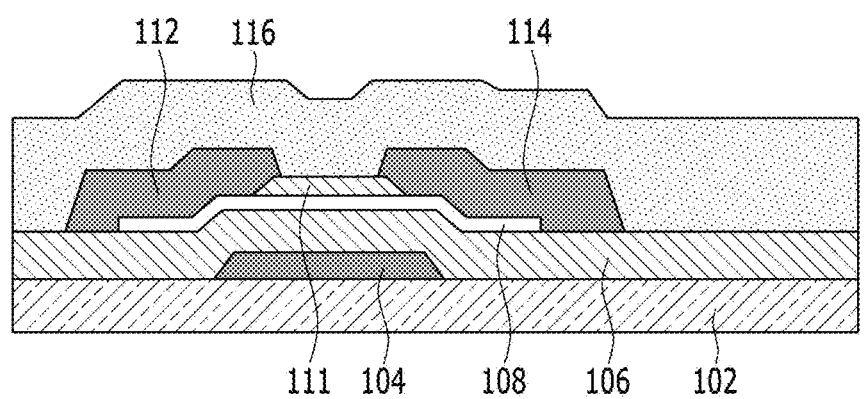

As shown in FIG. 1 and FIG. 2B, the etch stopper layer 111 may be disposed in parallel with the oxide semiconductor layer 108 on the oxide semiconductor layer 108. In addition, the etch stopper layer 111 may be provided in parallel with a pattern that is the same as that of the oxide semiconductor layer 108 in a cross-sectional view that is perpendicular to a semiconductor channel, as shown in FIG. 2D.

The etch stopper layer 111 may include an oxide or a metal oxide, and for example, may include one of $SiO_2$, $Al_2O_3$, and $SiN_x$.

Figure 2C:
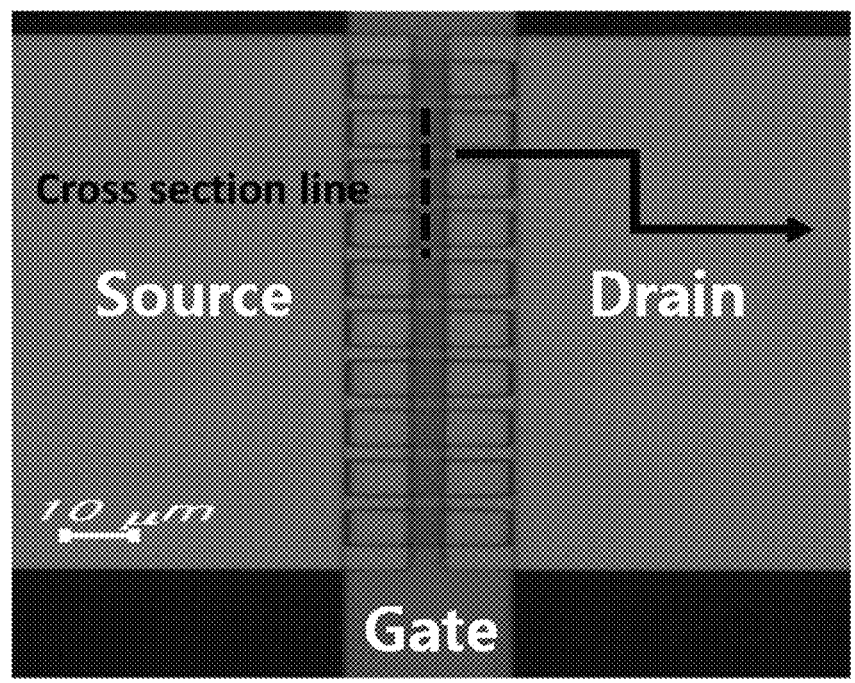
Figure 2D:
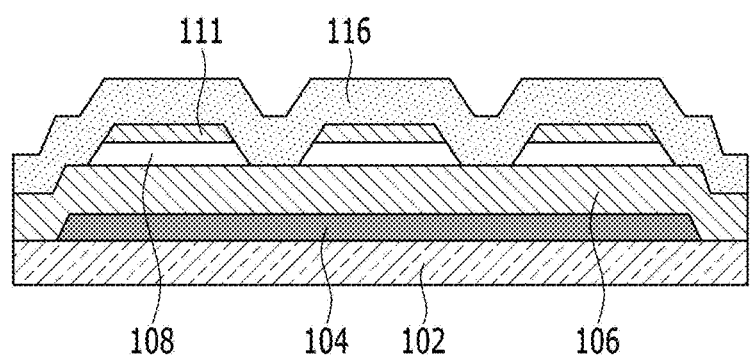
Figure 3A:
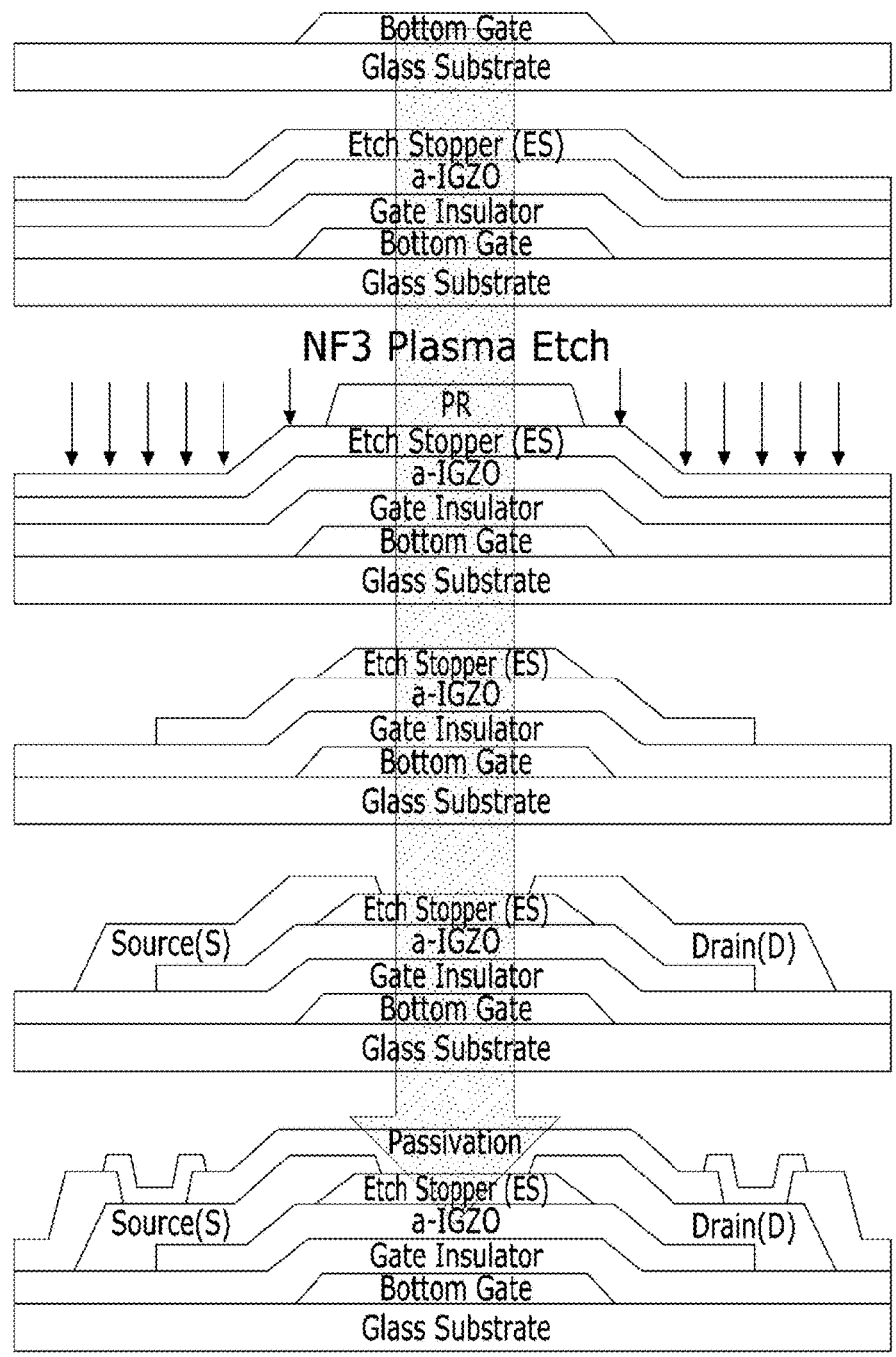
FIG. 3A and FIG. 3B show an overall process of a manufacturing method of an oxide semiconductor transistor according to an exemplary embodiment of the present invention.
Figure 3B:
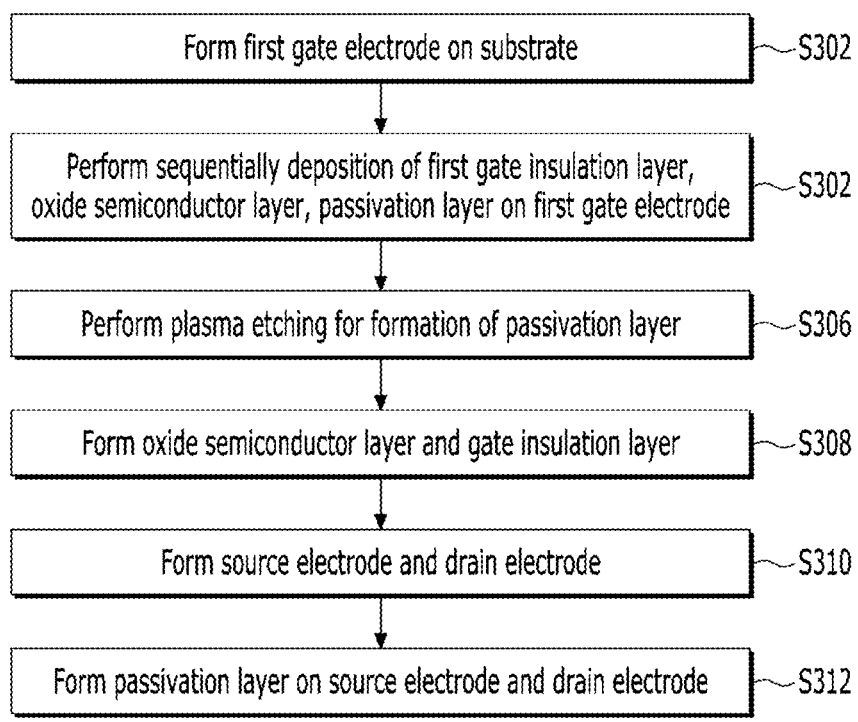
Figure 4A:
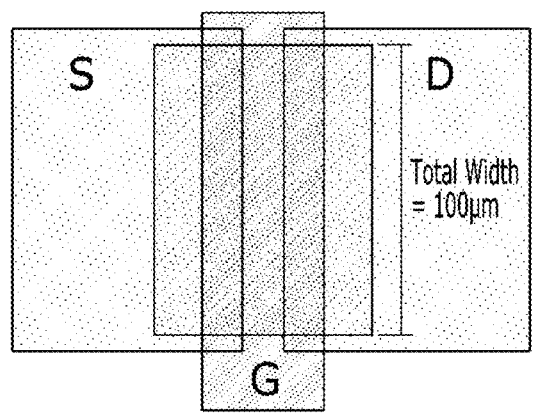
FIG. 4A and FIG. 4B show an oxide semiconductor island pattern according to the exemplary embodiment of the present invention.
Figure 4B:
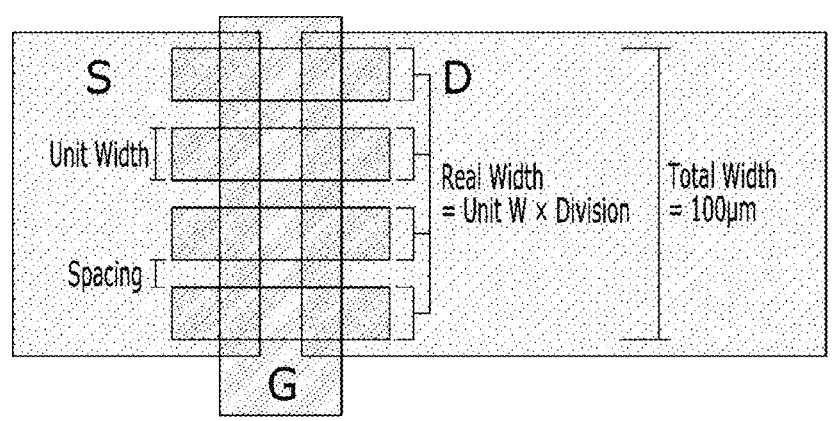

As shown in FIGS. 2A and 2C and FIG. 4B, the semiconductor oxide layer 108 and the etch stopper layer 111 may include a plurality of island patterns. The island patterns include two or more patterns, they may be apart from each other while having a constant space therebetween, and each island pattern may have the same width. However, the respective island patterns may have different widths, and they may be apart from each other with different spaces therebetween.

A width of each island may be about 1 μm to about 10 μm, and may preferably be about 1 μm to about 5 μm. The entire width of the plurality of island patterns may be smaller than the width of the source and drain electrodes 112 and 114 (refer to FIG. 4A and 4B). However, the width of the plurality of island patterns may be greater than the width of the first gate electrode 104. That is, the island patterns may be formed wider than a space between the source electrode 112 and the drain electrode 114, and may partially overlap the source and drain electrodes 112 and 114.

The distance between the plurality of island patterns may be about 1 μm to about 5 μm. As shown in FIG. 4B, a total width of the entire island patterns including the island patterns and the spaces therebetween may be in a range of about 100 μm to about 110 μm. An electrical characteristic of the oxide semiconductor transistor 100 can be improved by increasing the number of island patterns by reducing the width of each island pattern and the space between the island patterns while maintaining the total width to be in the above-stated range of 100 μm to 110 μm. The improvement of the electrical characteristic will be described later (referring to the description of FIG. 5A to FIG. 7F).

The island pattern of the etch stopper layer 111 may be disposed on the island pattern of the oxide semiconductor layer 108. The island pattern of the oxide semiconductor layer 108 and the island pattern of the etch stopper layer 111 may have the same width and the same space between the patterns. However, a width of the island pattern of the etch stopper layer 111 may be smaller than a width of the island pattern of the oxide semiconductor layer 108 as shown in FIGS. 4A and 4B, and a cross-sectional shape of the etch stopper layer 111 may be parallel with the island pattern of the oxide semiconductor layer 108 as shown in FIGS. 2B and 2D.

The island pattern of the semiconductor oxide layer 108 and the island pattern of the etch stopper layer 111 may be disposed in parallel with each other in plural as shown in FIG. 2 A to 2D and FIGS. 4A and 4B, and may be formed parallel with each other with respect to a width direction of the source electrode 112 and the drain electrode 114.

The number of island patterns is 2 to 50, and they may be formed with the same pattern and the same space. As shown in FIG. 4A, in the present exemplary embodiment, an electrical characteristic which will be described later can be improved by implementing two or more island patterns by using the same number of masks as an existing oxide semiconductor transistor that includes one semiconductor layer 108 where no island pattern is formed, and it can be experimentally determined that the electrical characteristic can be optimized when 20 to 50 island patterns are formed.

The source electrode 112 and the drain electrode 114 may be formed apart from each other while covering side and upper portions of the oxide semiconductor layer 108 and the etch stopper layer 111. In this case, the source electrode 112 and the drain electrode 114 may be disposed apart from each other while having a constant space with respect to a center axis of the etch stopper layer 111. That is, the source electrode 112 and the drain electrode 114 may be formed in parallel with each other while having a distance therebetween of as much as a space that opens the upper surface of the etch stopper layer 111. The source electrode 112 and the drain electrode 114 may include a metallic material, and for example, may include molybdenum (Mo).

As shown in FIGS. 2A and 2B, the oxide semiconductor transistor 100 according to the exemplary embodiment of the present invention may further include a passivation layer 116 that is provided on the source electrode 112, the drain electrode 114, the etch stopper layer 111, and the gate insulating layer 106.

Here, the passivation layer 116 may include an oxide or a metal oxide, and for example, may include a silicon oxide ($SiO_x$).

FIG. 9A to FIG. 9D, FIG. 10A and FIG. 10B show an oxide semiconductor transistor that includes a second gate electrode 120 according to another exemplary embodiment of the present invention. The above-described portion will not be further described in order to avoid redundancy.

As shown in FIG. 9A to FIG. 9D, FIG. 10A and FIG. 10B, an oxide semiconductor transistor 100 may further include a passivation layer 116 that is provided on a source electrode 112, a drain electrode 114, and an etch stopper layer 111, and pixel electrodes 118 and 119 may be respectively electrically connected with the source electrode 112 and the drain electrode 114 while penetrating the passivation layer 116. By such an electrical connection, the pixel electrodes 118 and 119 serve to electrically connect the source electrode 112 and the drain electrode 114 to other external constituent elements of the oxide semiconductor transistor 100 for a display element. The pixel electrodes 118 and 119 may include a metallic material, and for example, may include molybdenum (Mo).

Figure 10A:
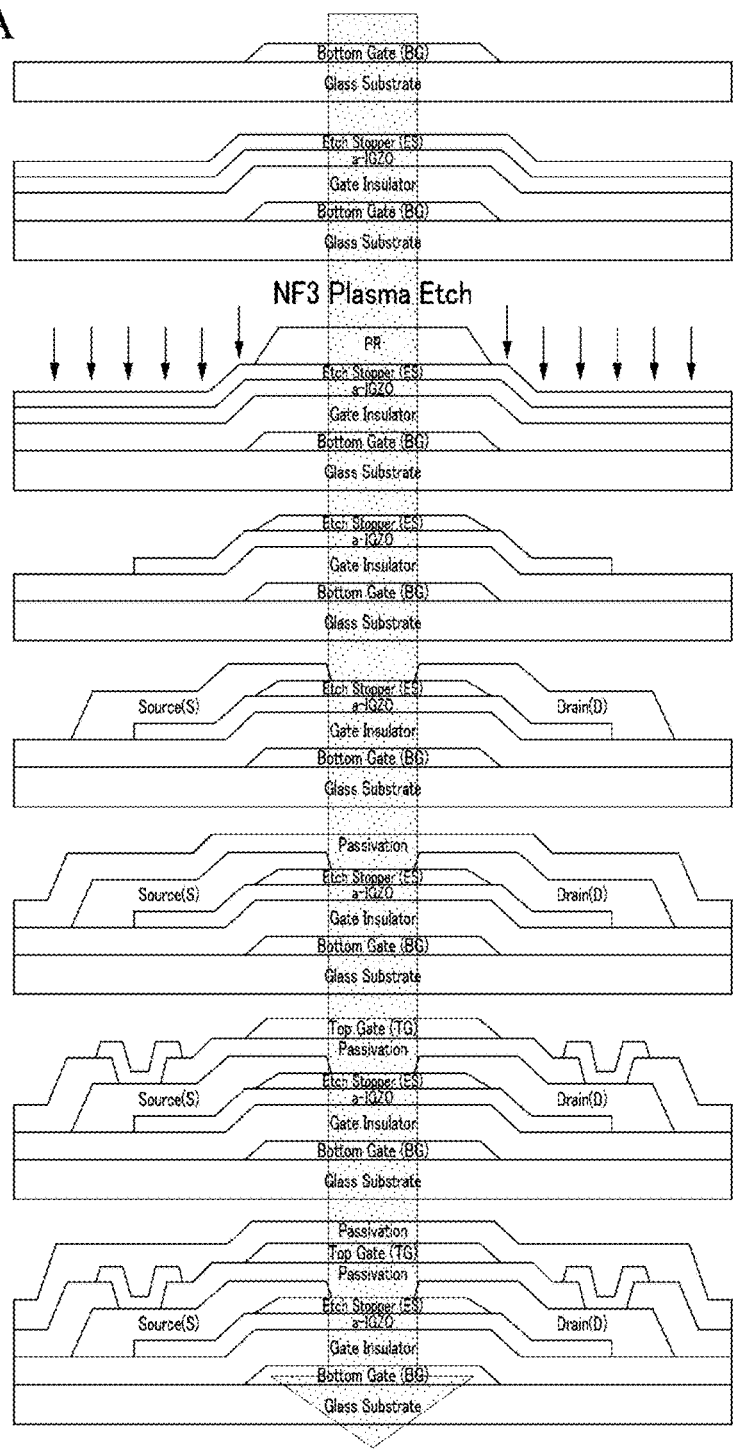
FIG. 10A and FIG. 10B show an overall flow of a manufacturing method of the oxide semiconductor transistor according to the other exemplary embodiment of the present invention.
Figure 10B:
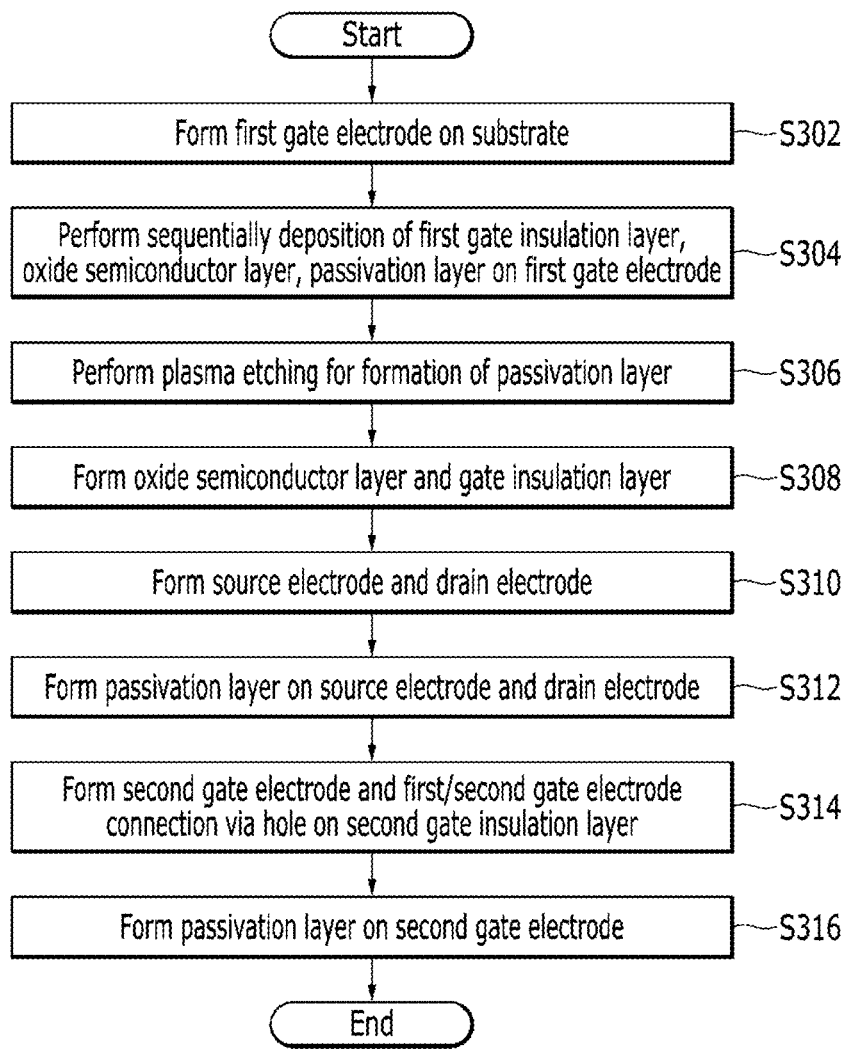

The oxide semiconductor transistor 100 may further include a second gate electrode 120 that is provided on the passivation layer 116. The second gate electrode 120 may be provided corresponding to the first gate electrode 104. In addition, as shown in FIG. 9A to 9D, a cross-sectional width of the second gate electrode 120 may be greater than a cross-sectional distance between a cross-section of the source electrode 112 and a cross-section of the drain electrode 114. In addition, as shown in FIGS. 10A and 10B, a cross-sectional width of the second gate electrode 120 may be smaller than a cross-sectional distance between the source electrode 112 and the drain electrode 114.

In this case, distances between ends of the source and drain electrodes 112 and 114 and ends of the second gate electrodes 120 are defined as spacing distances 124.

As shown in FIG. 9A to 9D, when the cross-sectional width of the second gate electrode 120 is greater than the cross-sectional distance of the source electrode 112 and the drain electrode 114, that is, no spacing distance 124 is formed, a parasitic voltage may be generated between the second gate electrode 120, the source electrode 112, and the drain electrode 114, and accordingly, a characteristic of the oxide semiconductor transistor, which is a high-performance electrical characteristic, may be deteriorated. On the other hand, as shown in FIG. 10A and 10B, when the cross-sectional width of the second gate electrode 120 is smaller than the cross-sectional distance of the source electrode 112 and the drain electrode 114, generation of a parasitic voltage between the second gate electrode 120, the source electrode 112, and the drain electrode 114 can be minimized, thereby acquiring a high-performance electrical characteristic. The width of the second gate electrode 120 may be about 1.5 μm or more, and may be in a range of about 1.5 μm to about 10 μm. The spacing distance 124 may preferably be in a range between about 0.5 μm and about 5 μm.

As described above, when the second gate electrode 120 is disposed on the passivation layer 116 and the same voltage is applied to the passivation layer 116 and the second gate electrode 120, a width of a channel formed in the oxide semiconductor layer 108 can be increased. Accordingly, the amount of current that passes through the source electrode 112 and the drain electrode 114 can be increased and the oxide semiconductor transistor 100 can be stabilized in a reliability test with respect to a positive voltage, a negative voltage, and light. Thus, the electrical characteristic of the oxide semiconductor transistor 100 for the display element according to the present exemplary embodiment can be improved.

The second gate electrode 120 may include a metallic material that can block light, or a transparent light-transmissive metallic material.

According to the present exemplary embodiment, a connection electrode (not shown) that can electrically connect the first gate electrode 104 and the second gate electrode 120 may be further included. The connection electrode may serve to apply the same voltage to the first gate electrode 104 and the second gate electrode 120. Since the first gate electrode 104 and the second gate electrode 120 can be simultaneously applied with a voltage through one connection electrode, a simple structure that does not require an additional device can be implemented, and the connection electrode and the second gate electrode 120 can be simultaneously formed, thereby increasing productivity in a manufacturing process.

Further, the first gate electrode 104 can be omitted, and the oxide semiconductor transistor 100 can include only the second gate electrode 120.

Hereinafter, the electrical characteristic of the oxide semiconductor transistor 100 for the display element according to the exemplary embodiment of the present invention will be described with reference to FIG. 5A to FIG. 7F.

Figure 5A:
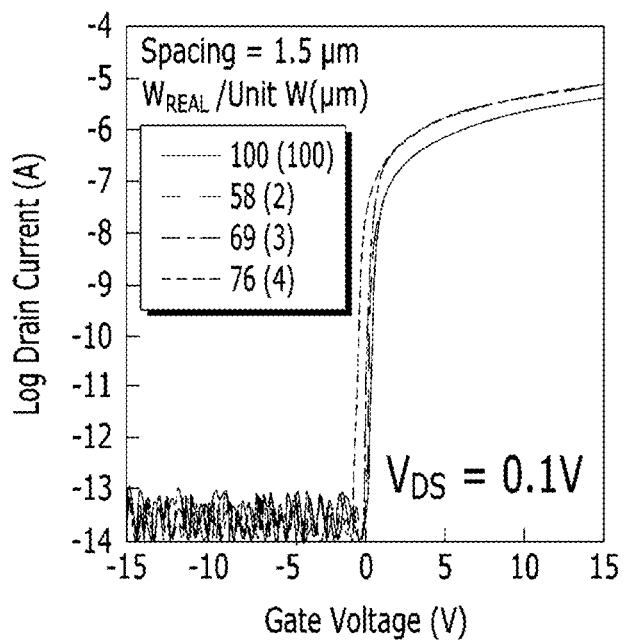
FIG. 5A to FIG. 5D show graphs of transfer curves and output curves of the oxide semiconductor transistor according to the exemplary embodiment of the present invention.
Figure 5B:
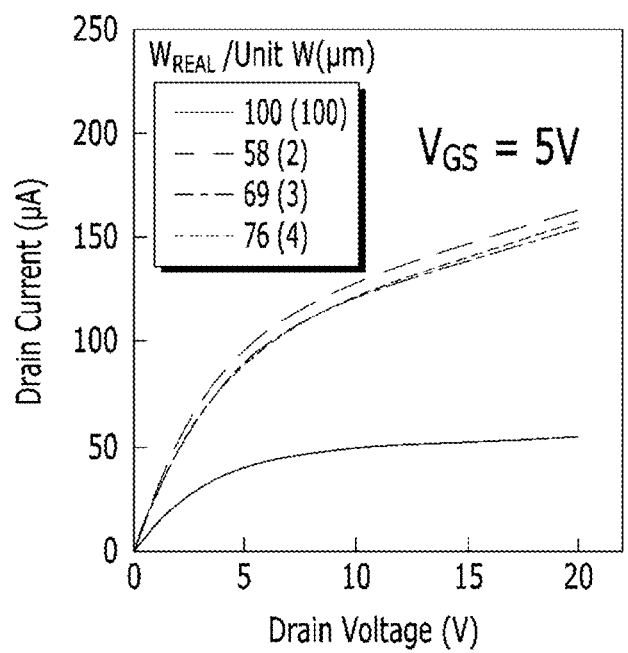
Figure 5C:
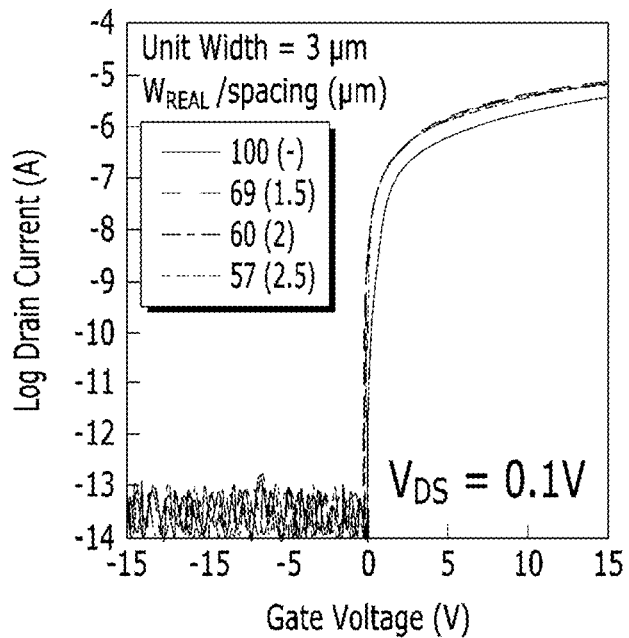
Figure 5D:
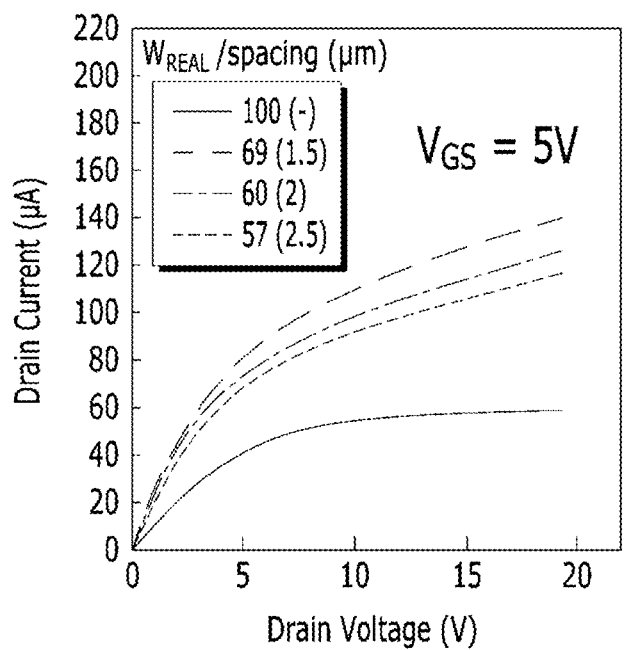

FIG. 5A to 5D shows graphs respectively illustrating transfer curves and output curves according to the number of island patterns and the spacing distances. In FIG. 5A and 5B, the spacing distance is set to 1.5 µm and a width of each island pattern is changed. It can be observed that a transfer characteristic and an output characteristic of a thin film transistor (TFT) are improved as the width of each island pattern is reduced (i.e., as the number of island patterns is increased). In FIG. 5C and 5D, a width of each island pattern is set to 3 µm, and it can be observed that a transfer characteristic and an output characteristic of a thin film transistor (TFT) are improved as the spacing distance is shortened (i.e., as the number of island patterns is increased).

Figure 6A:
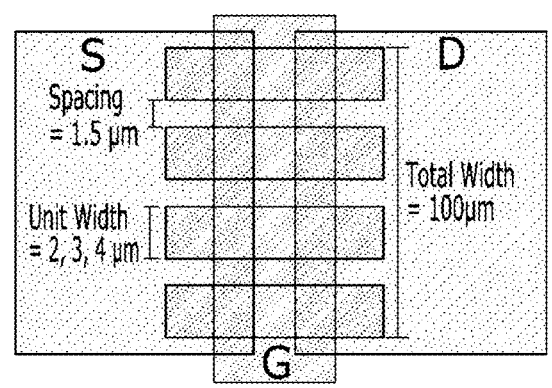
FIG. 6A to FIG. 6F show characteristic graphs and island patterns according to a threshold voltage and a swing value depending on an island pattern structure of the oxide semiconductor transistor according to the exemplary embodiment of the present invention.
Figure 6B:
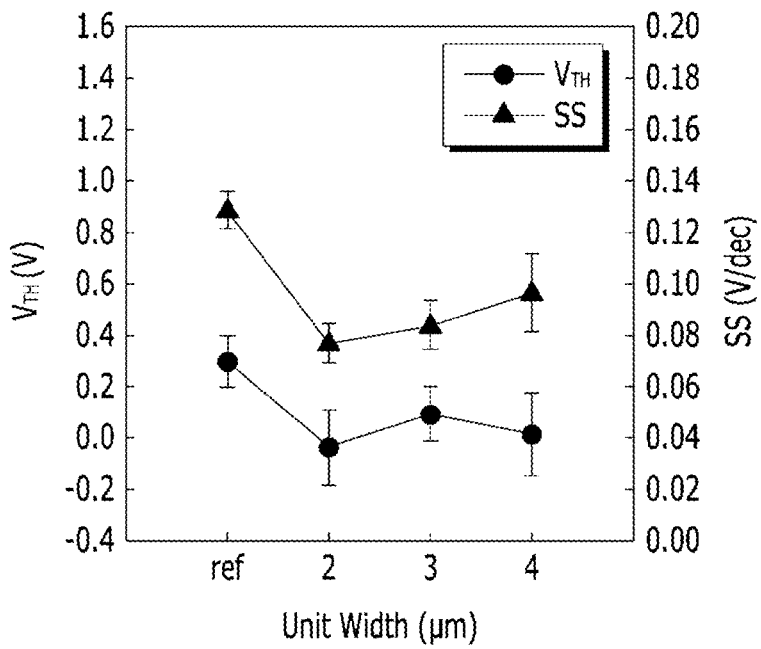
Figure 6C:
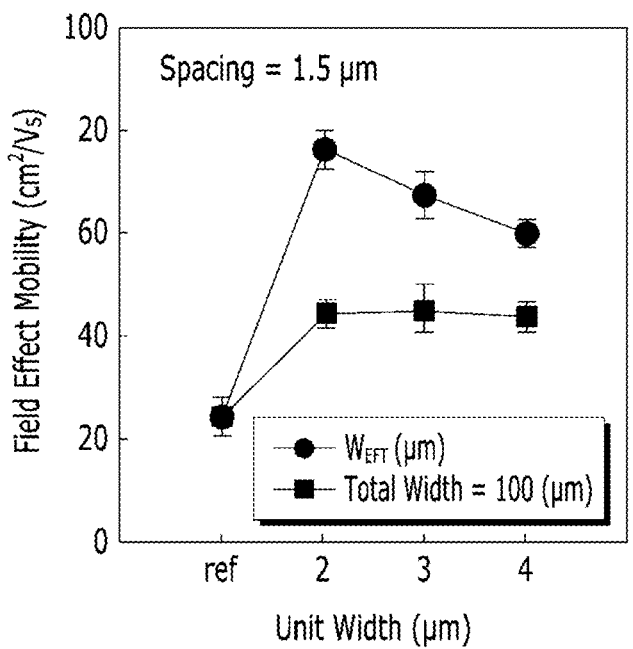
Figure 6D:
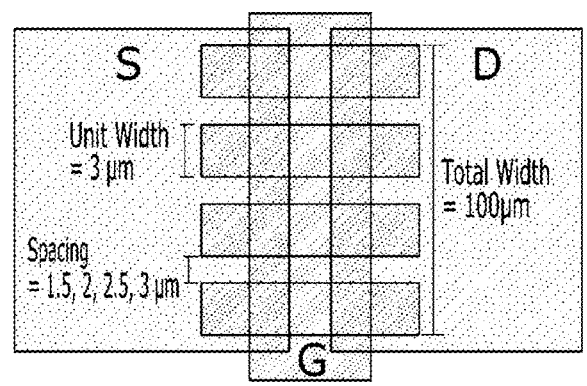
Figure 6E:
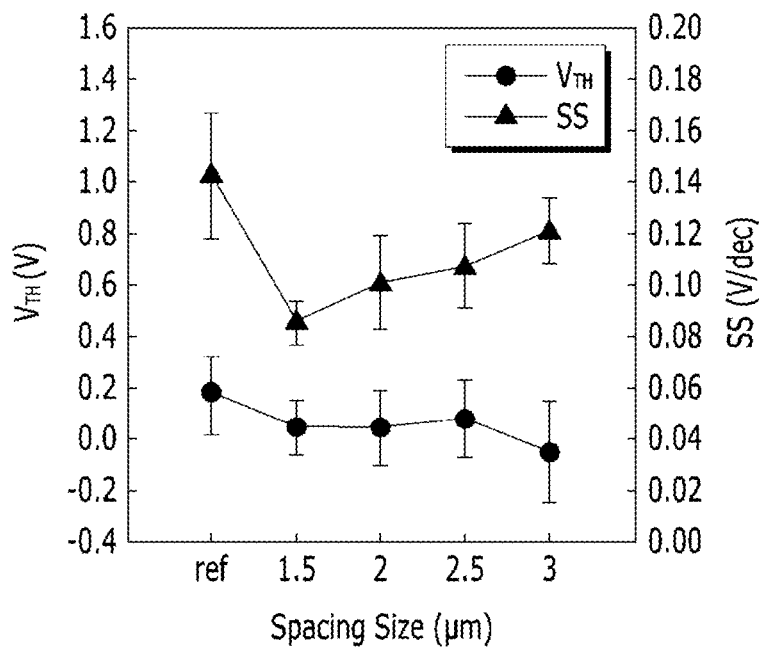
Figure 6F:
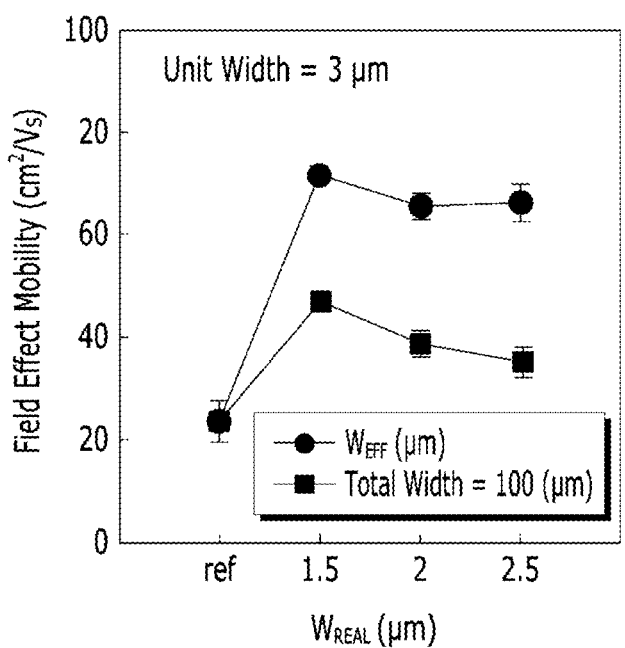

FIG. 6A to 6F shows a threshold value and a swing value according to the number of island patterns. In FIG. 6A, 6B, and 6C, the spacing distance is set to 1.5 µm and a width of each island pattern is changed. It can be observed than a subthreshold swing value of the TFT is increased and a value of mobility is increased as the width of each island pattern is reduced (i.e., as the number of island patterns is increased). In FIG. 6D, 6E, and 6F, when the width of each island pattern is set to 3 µm, it can be observed that the subthreshold swing value of the TFT is decreased and the value of mobility is increased as the spacing distance is shortened (i.e., as the number of island patterns is increased).

Figure 7A:
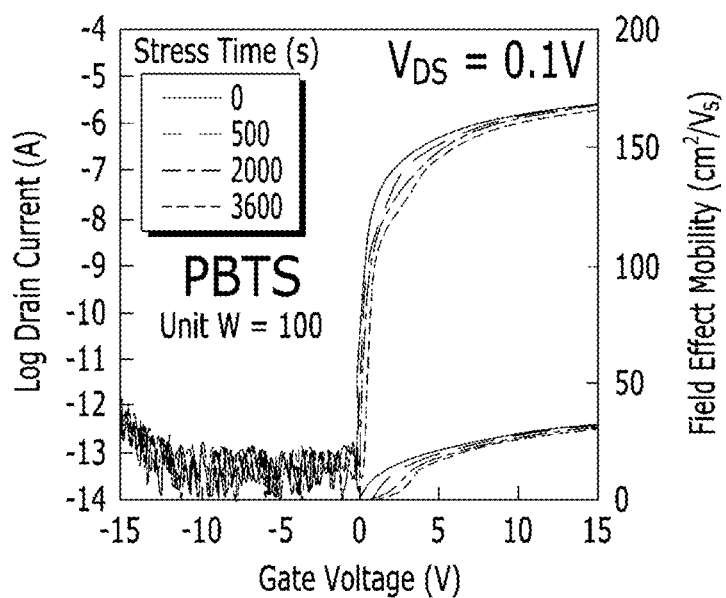
FIG. 7A to FIG. 7F show graphs that respectively illustrate electrical characteristics of the oxide semiconductor transistor when a positive voltage (e.g., +20 V) and a temperature of 60° C. are applied and when a drain current (100 μA) and a temperature of 60° C. are applied.
Figure 7B:
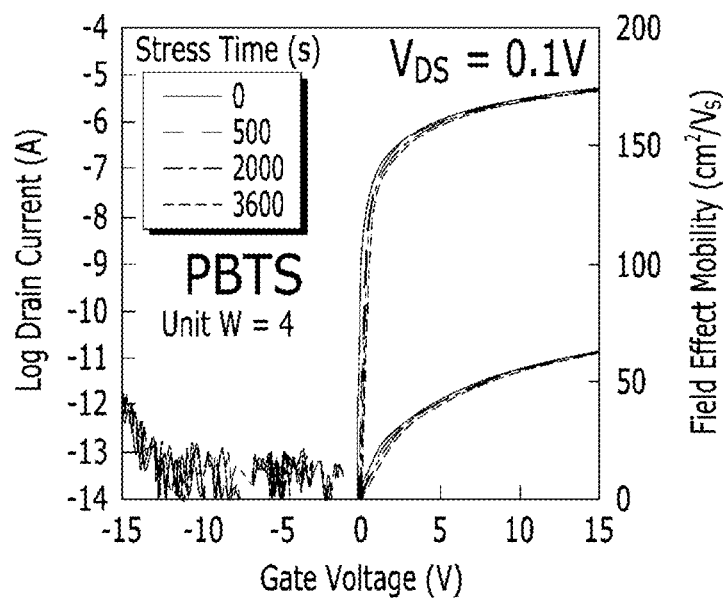
Figure 7C:
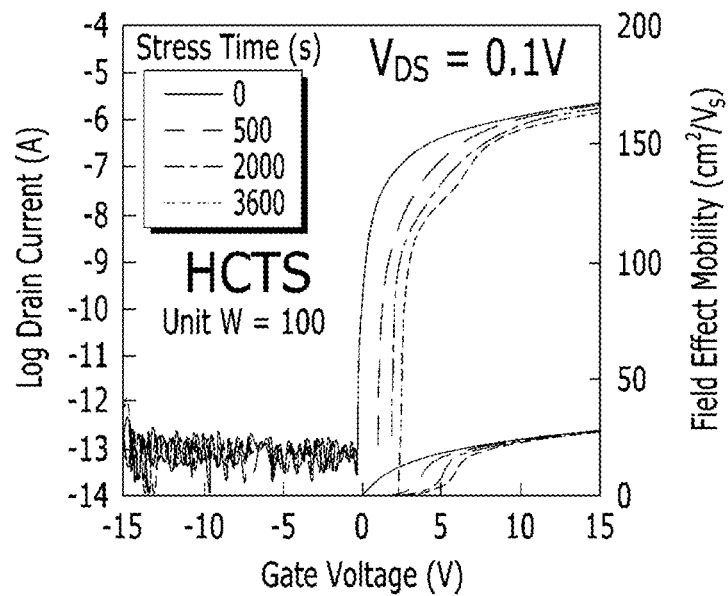
Figure 7D:
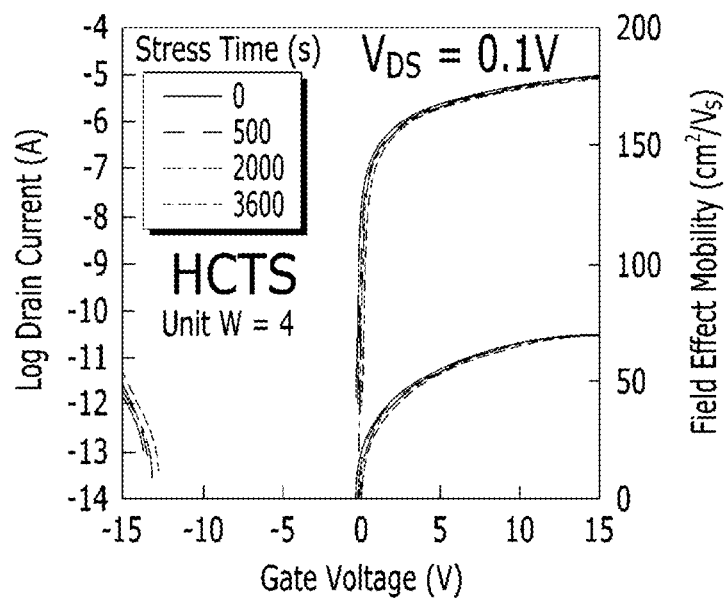
Figure 7E:
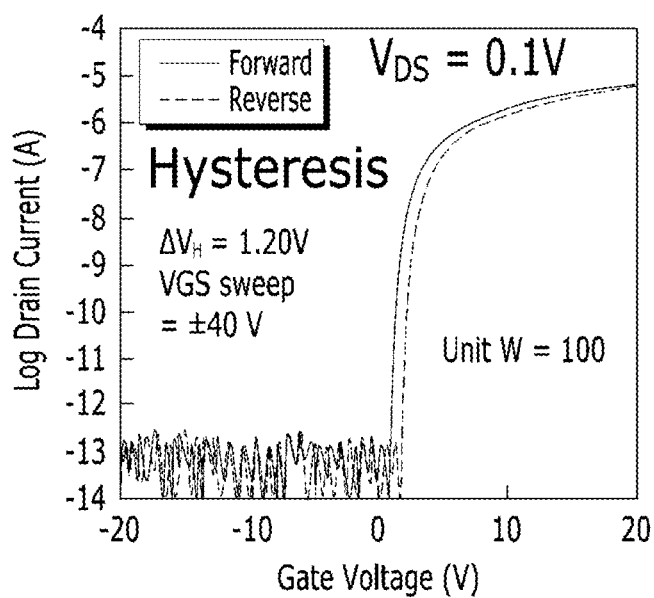
Figure 7F:
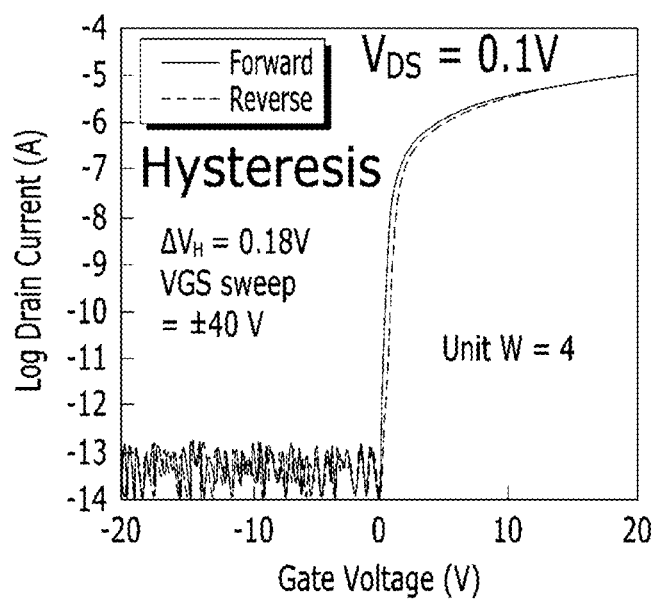
Figure 8A:
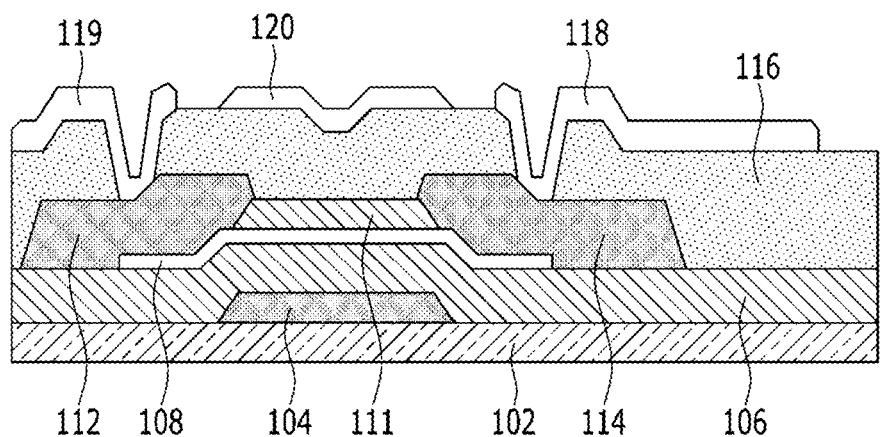
FIG. 8A to FIG. 8D and FIG. 9A to FIG. 9D are cross-sectional views of an oxide semiconductor transistor according to another exemplary embodiment of the present invention.
Figure 8B:
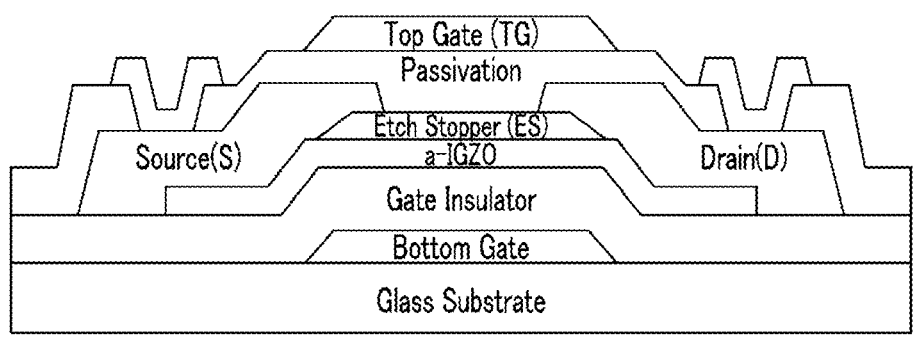
Figure 8C:
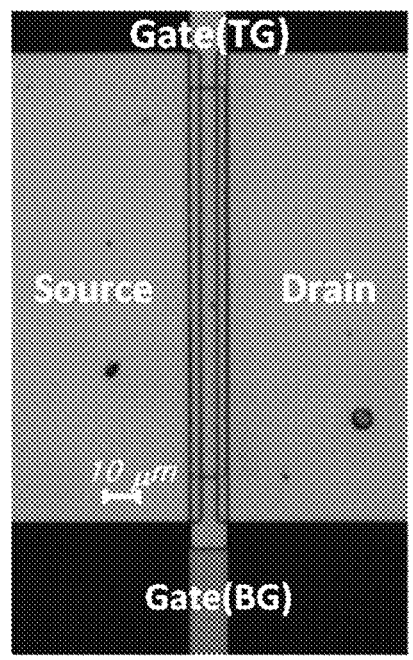
Figure 8D:
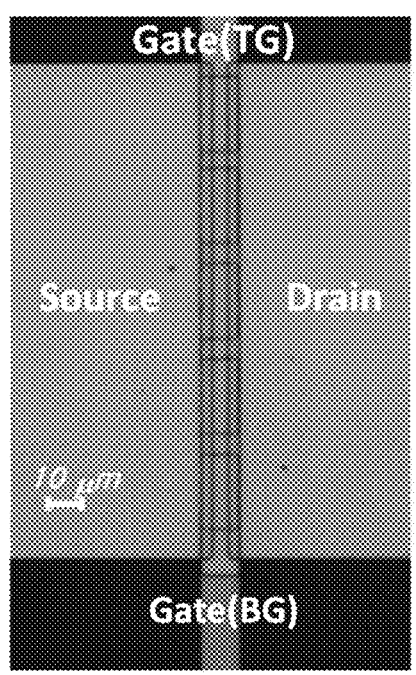
Figure 9A:
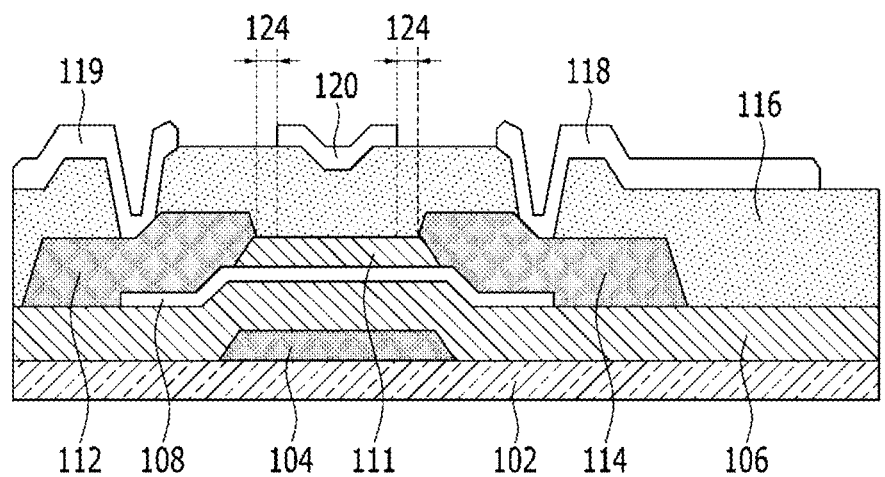
Figure 9B:
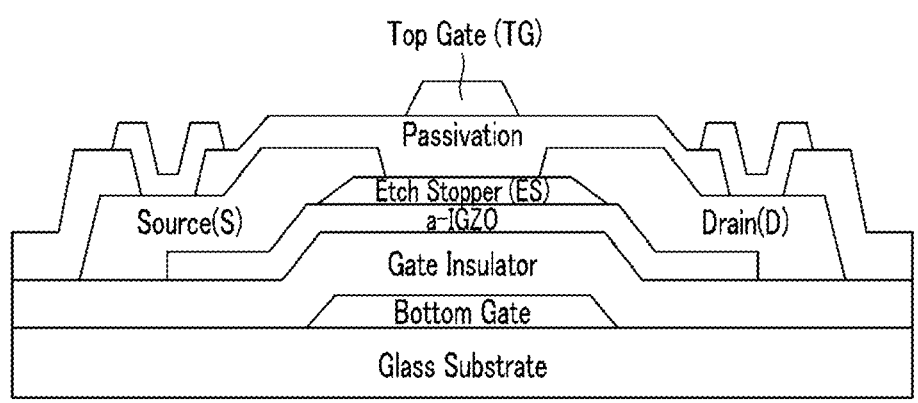
Figure 9C:
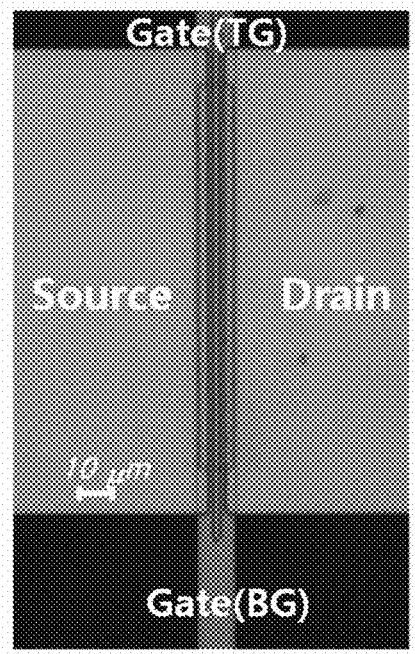
Figure 9D:
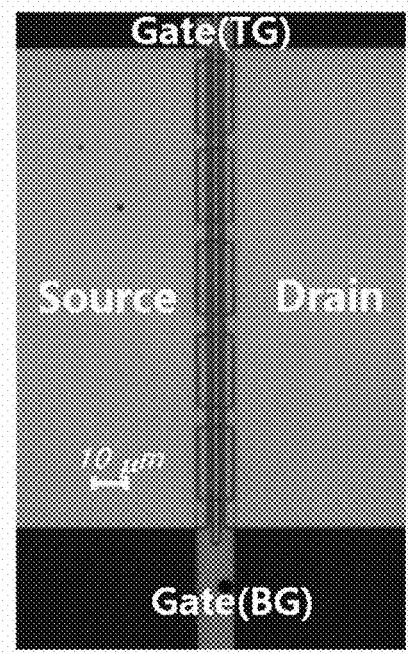

FIG. 7A to 7F shows graphs respectively illustrating electrical characteristics with application of a positive voltage (e.g., +20 V) and a drain current (IDS=100 µm) at a chuck temperature of 60° C., respectively. Comparing 7A and 7B, a characteristic of the TFT is deteriorated as a positive bias stress time is increased when one island pattern is formed ((a)), but when the island pattern is provided in plural (i.e., an island pattern width is 4 µm, a spacing distance is 1.5 µm, and a width of a semiconductor layer that includes the island patterns is 100 µm (i.e., in case of (b)), the characteristic of the TFT is not changed even through the positive bias is applied for a long period of time. FIG. 7C and 7D show that a TFT characteristic change according to high current stress when one island pattern is formed and when a plurality of island patterns are formed, respectively, and it can be observed that results are the same as those of 7A and 7B. In addition, FIG. 7E and 7F are graphs illustrating transfer characteristic hysteresis of the TFT by continuously measuring a voltage sweep at −40 V →+40 V and +40 V→−40 V so as to measure a transfer characteristic of the TFT, and when one island pattern is formed, Vth is changed by about 1.2 V but when the plurality of island patterns are formed, Vth is changed by about 0.18 V, which means that Vth is hardly changed.

Figure 11:
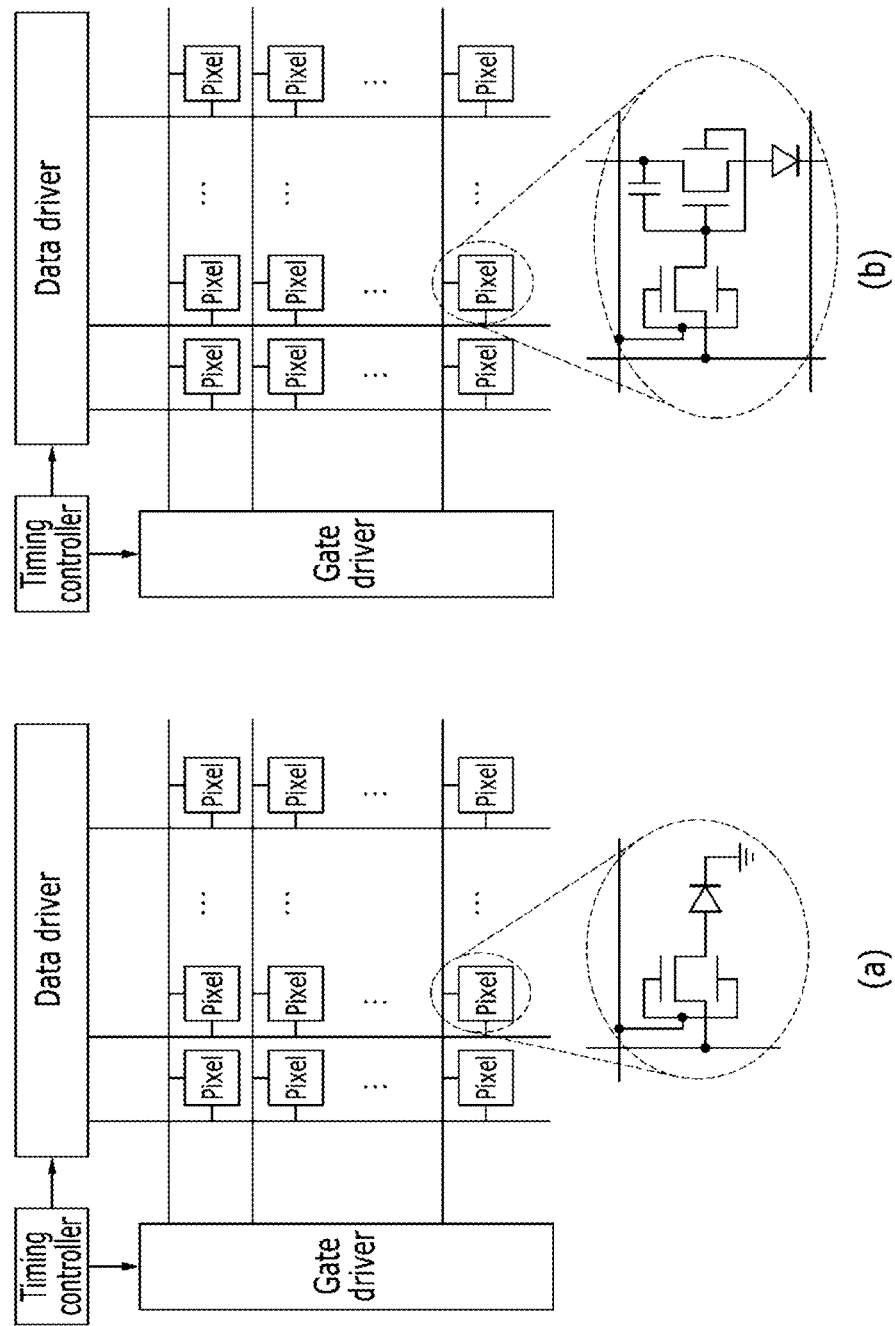
FIG. 11 is a schematic view in case of application of the oxide semiconductor transistor to an LCD panel and an AMLOED panel according to the exemplary embodiment of the present invention.
Figure 12A:
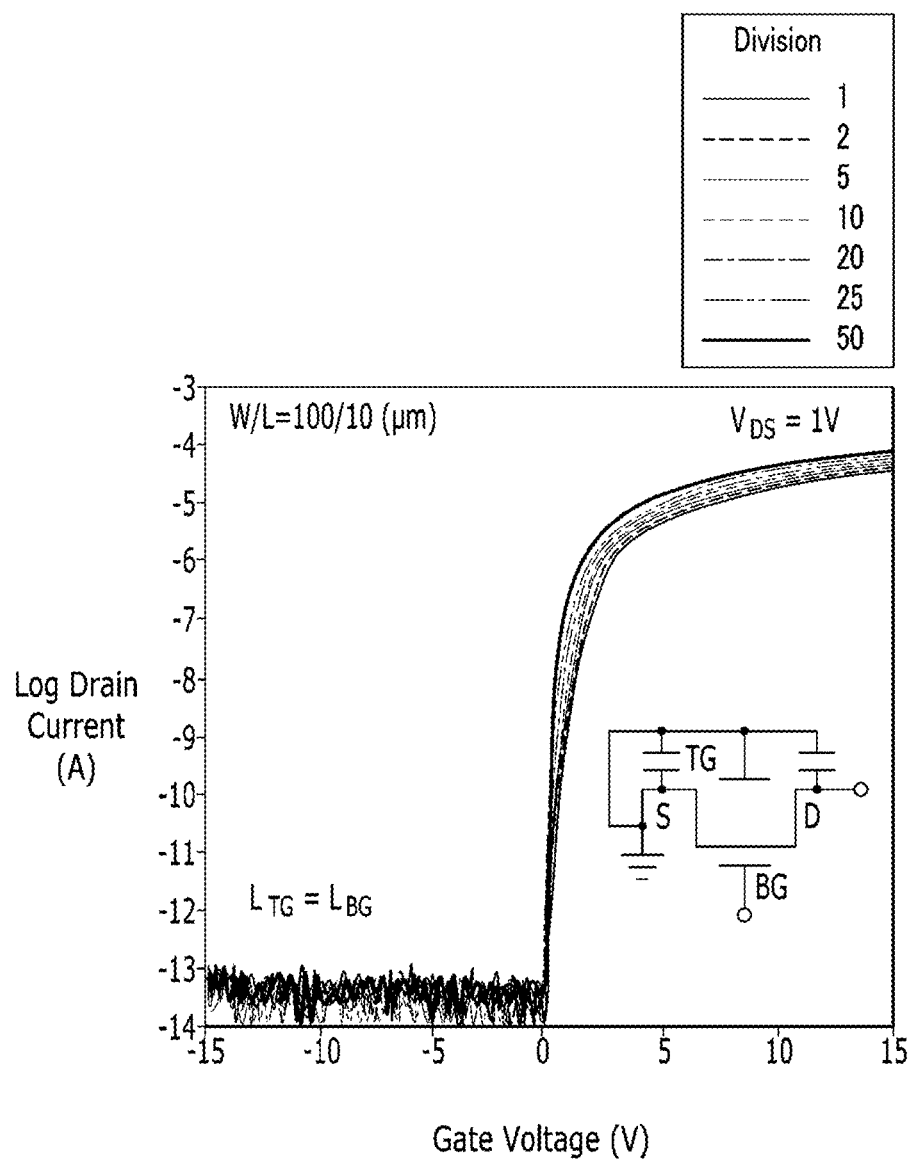
FIG. 12A to FIG. 12F, FIG. 13A to FIG. 13F, FIG. 14A to FIG. 14F, and FIG. 15A to FIG. 15F show electrical characteristics according to another exemplary embodiment of the present invention.
Figure 12B:
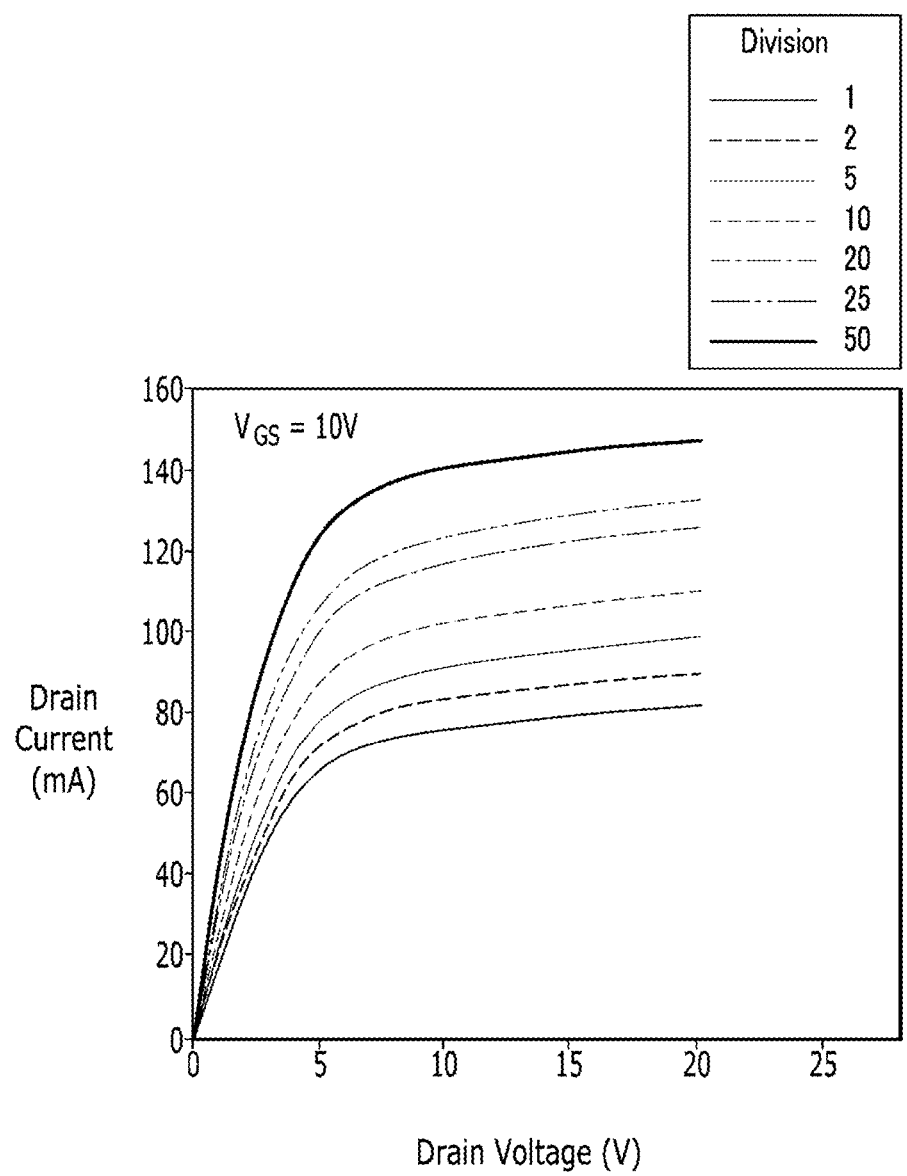
Figure 12C:
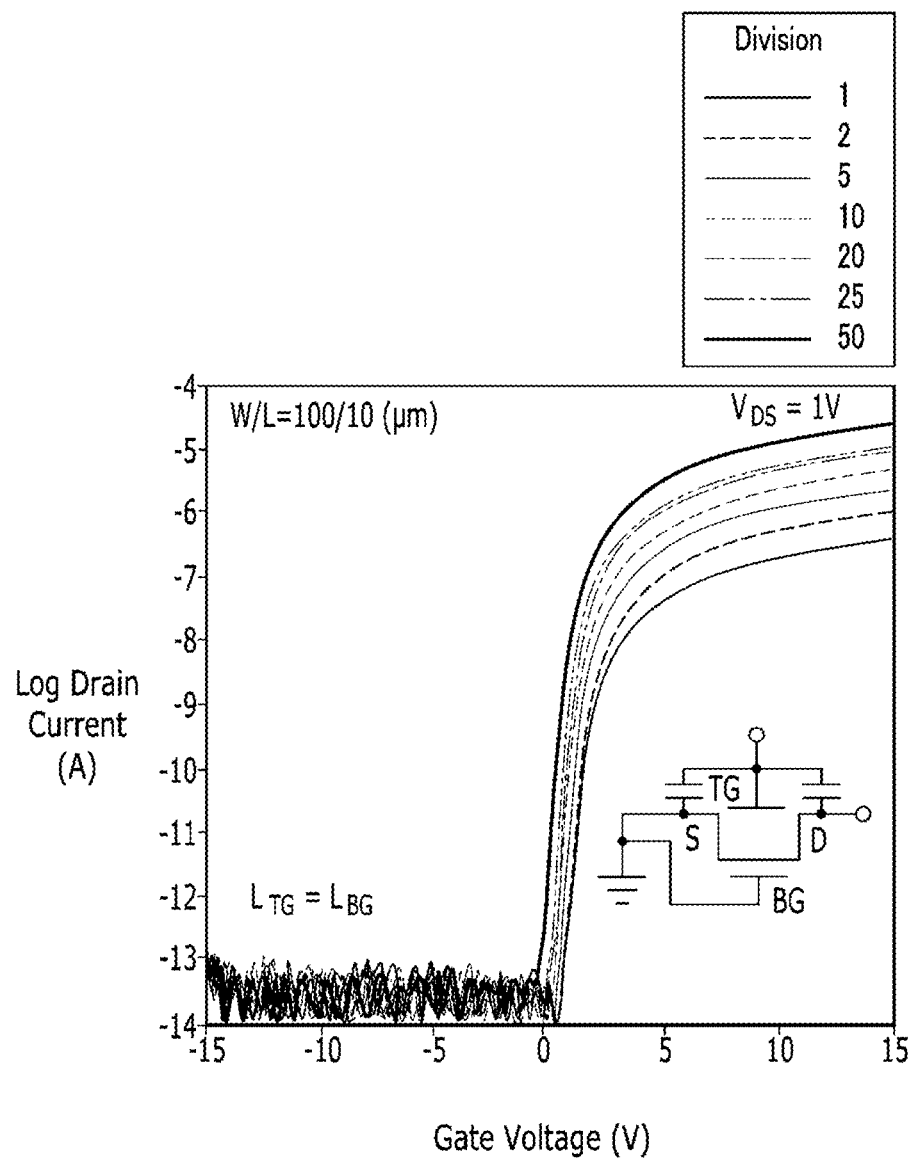
Figure 12D:
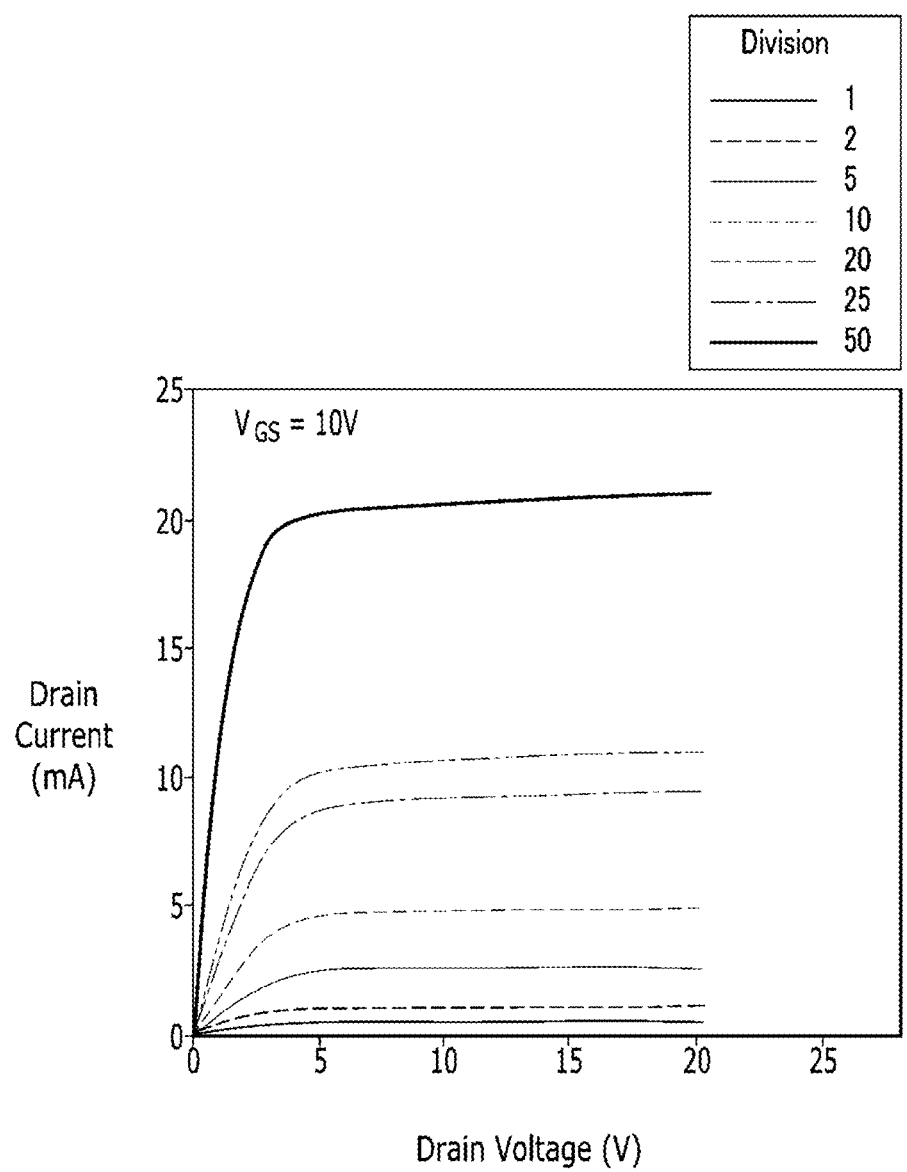
Figure 12E:
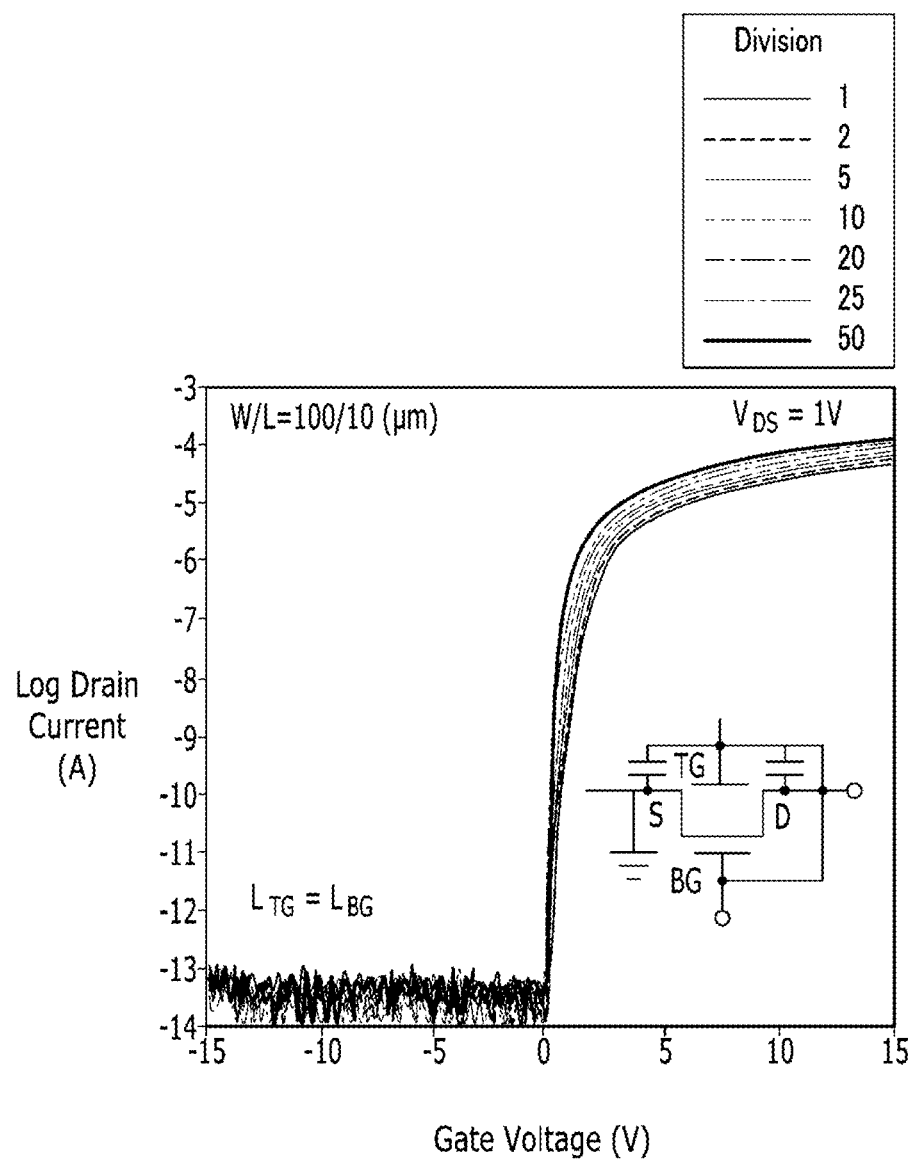
Figure 12F:
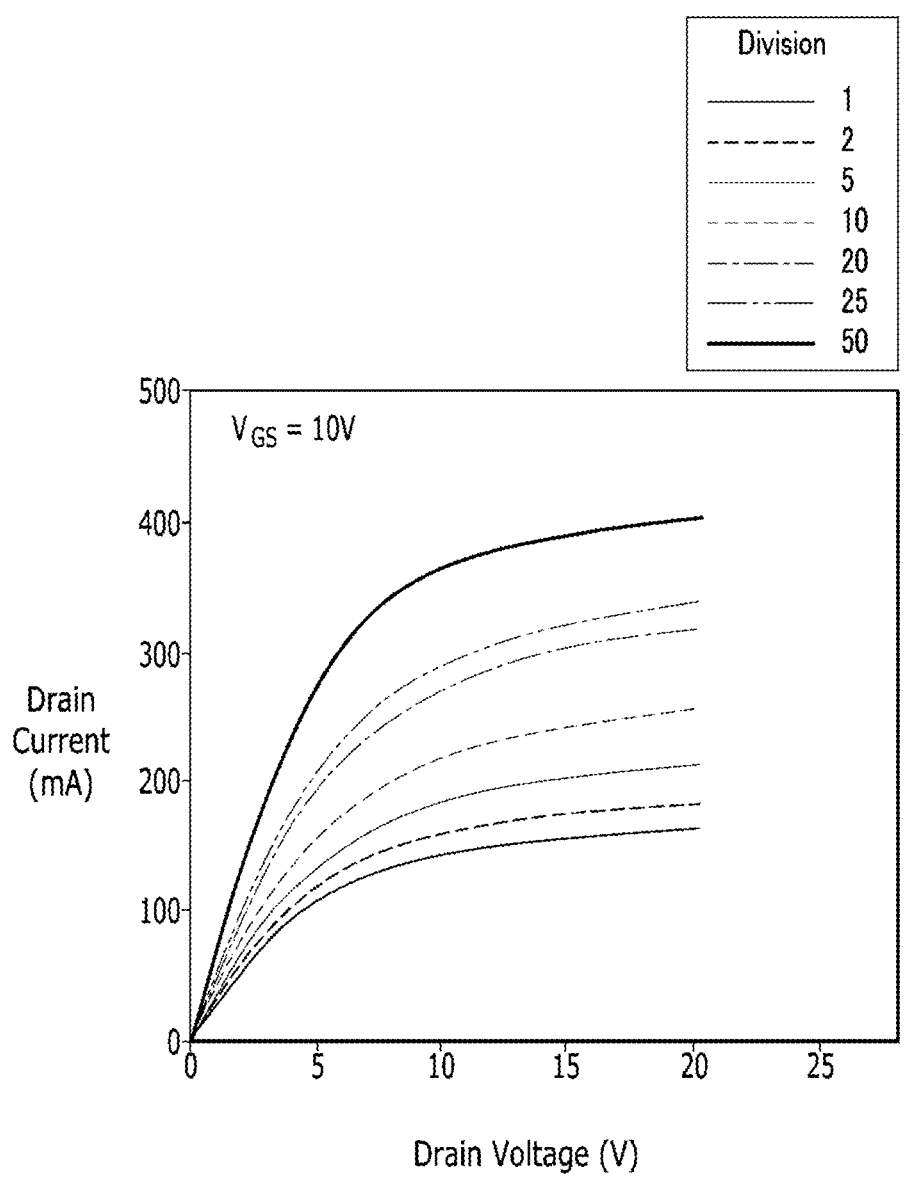
Figure 13A:
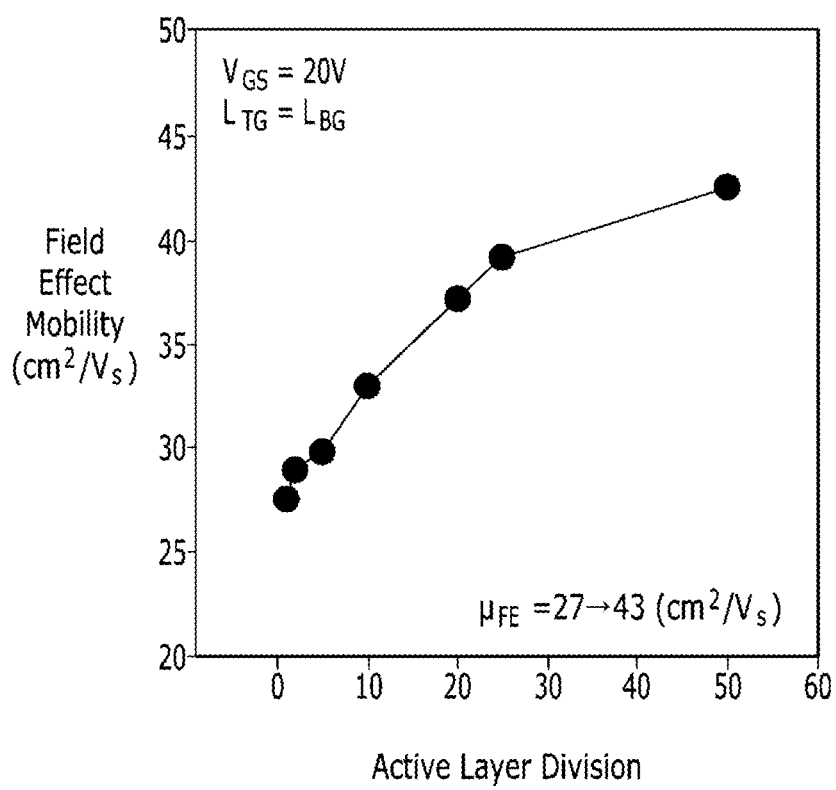
Figure 13B:
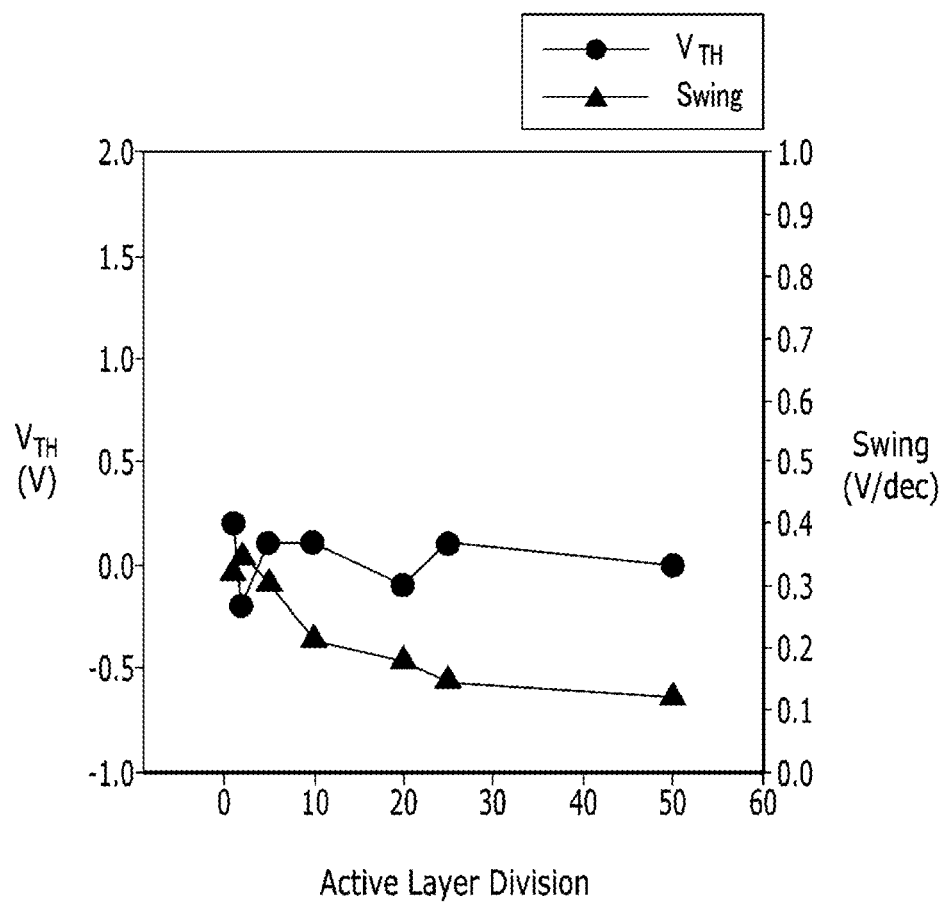
Figure 13C:
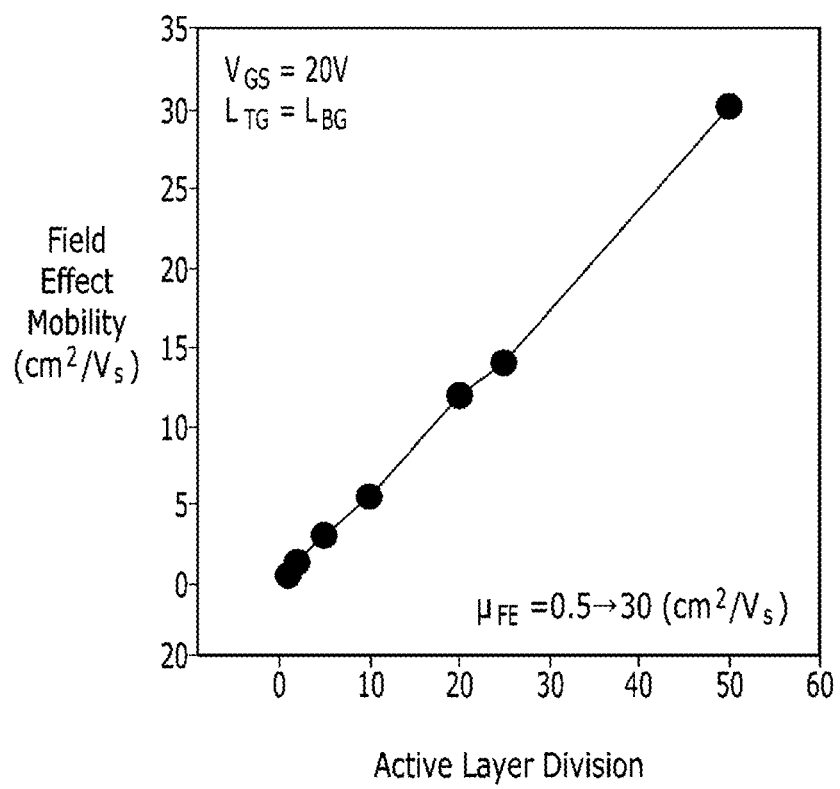
Figure 13D:
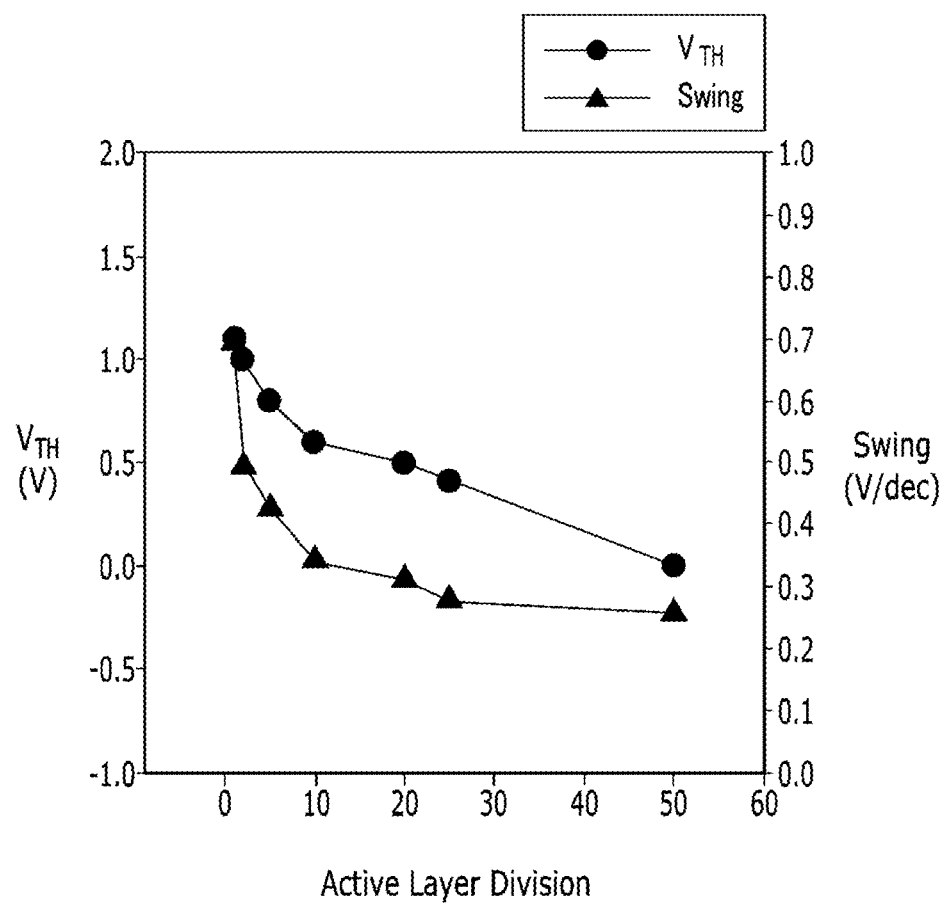
Figure 13E:
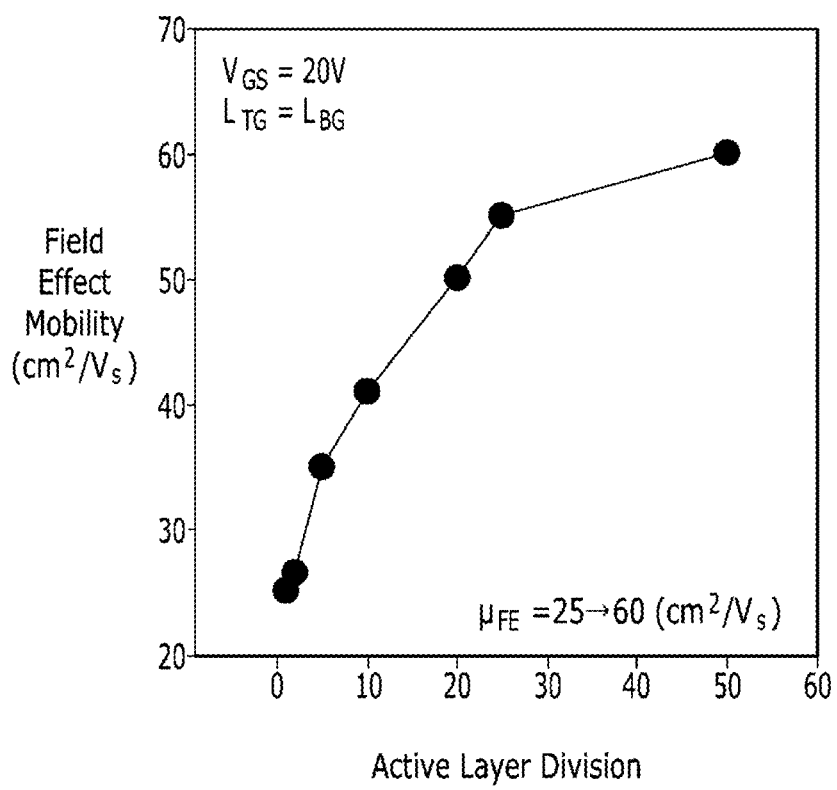
Figure 13F:
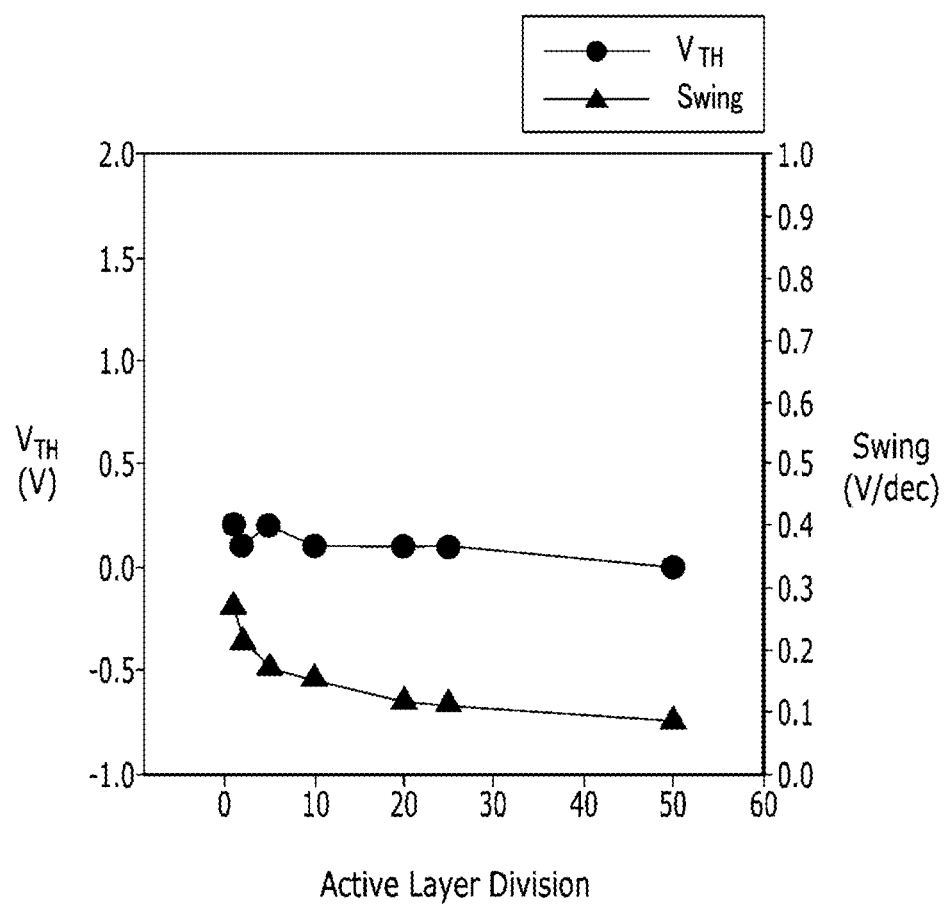
Figure 14A:
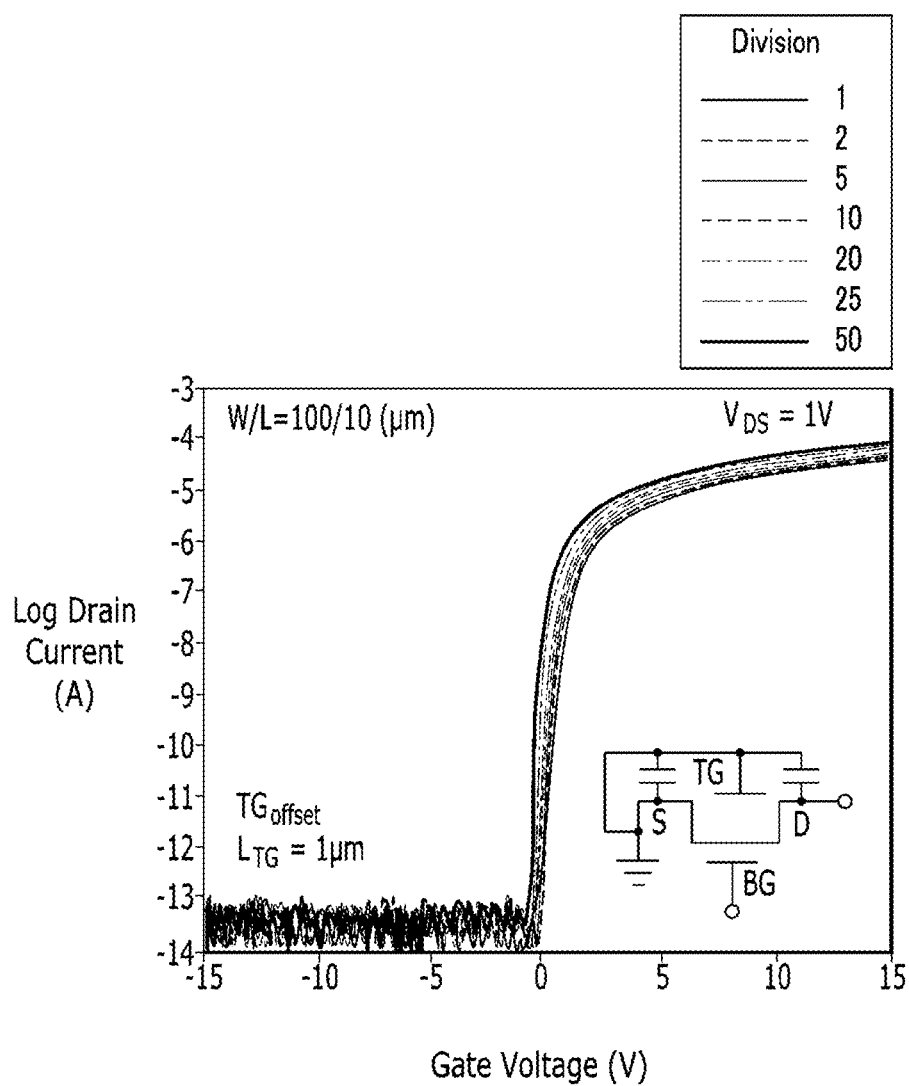
Figure 14B:
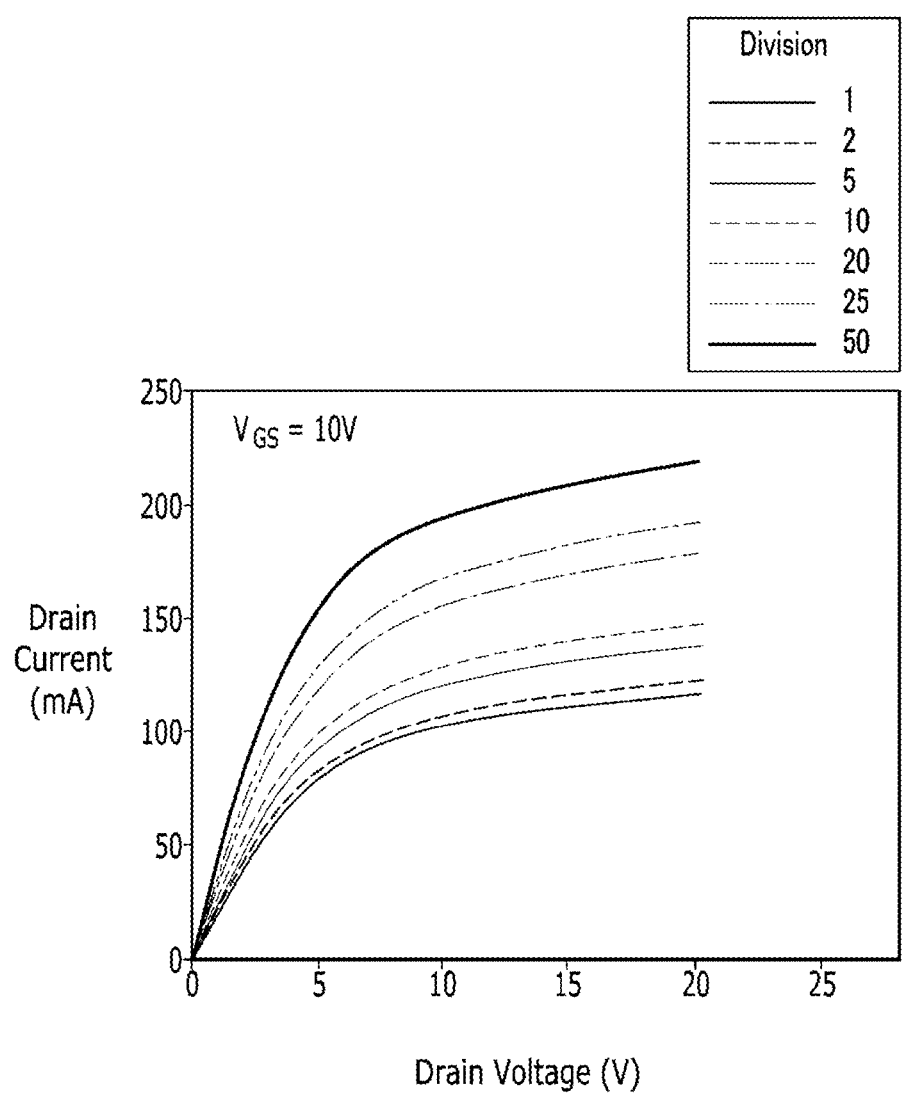
Figure 14C:
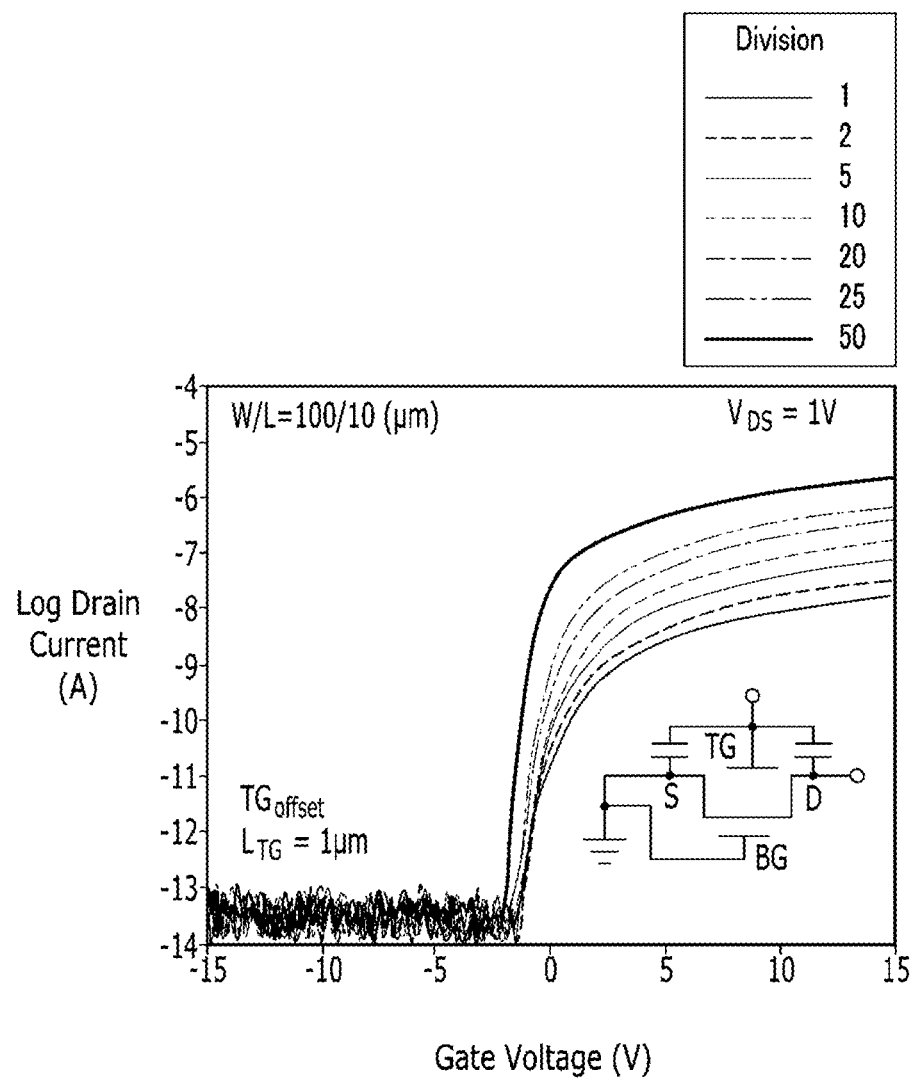
Figure 14D:
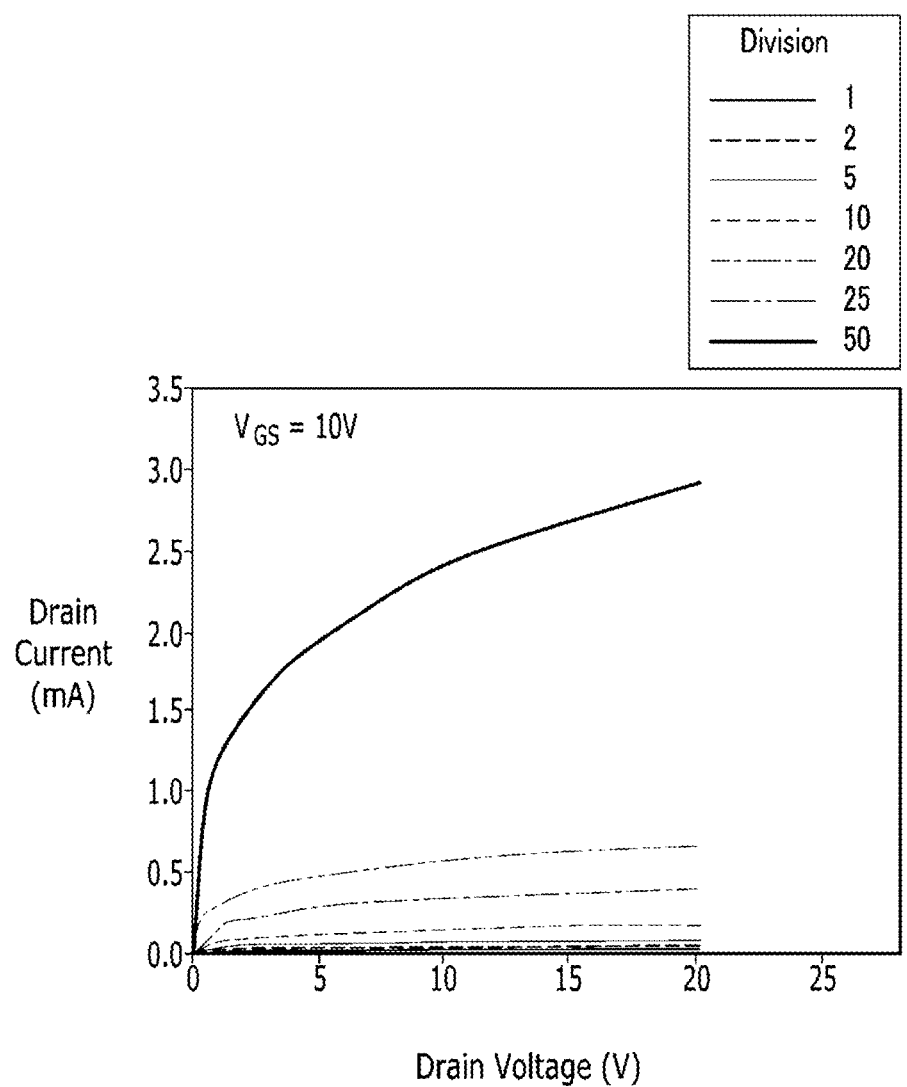
Figure 14E:
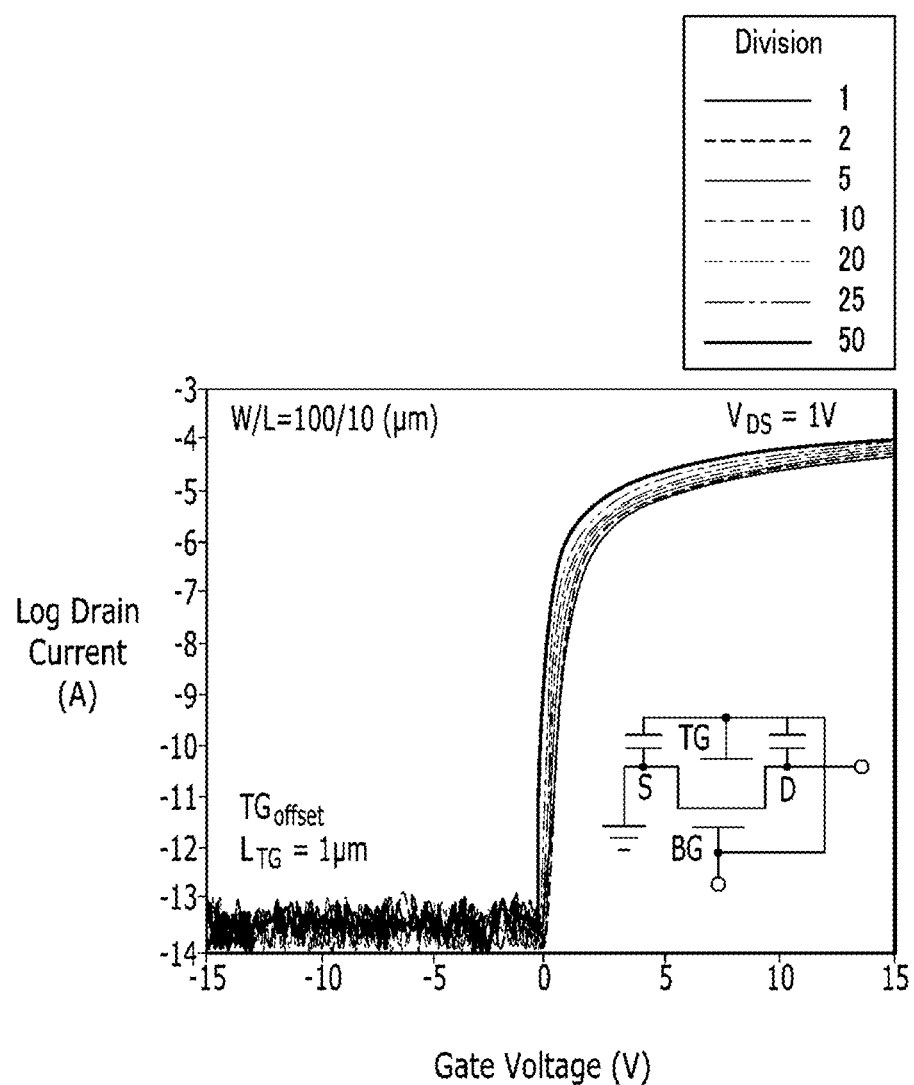
Figure 14F:
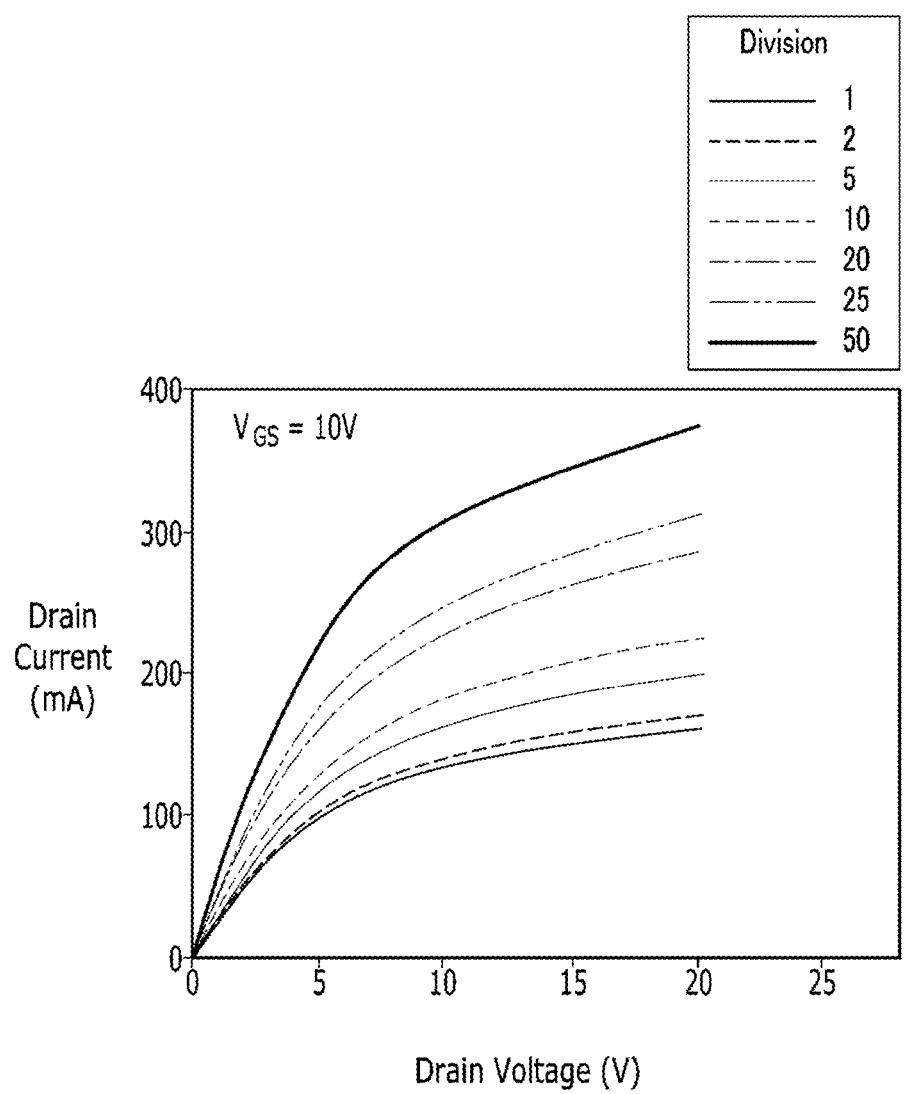
Figure 15A:
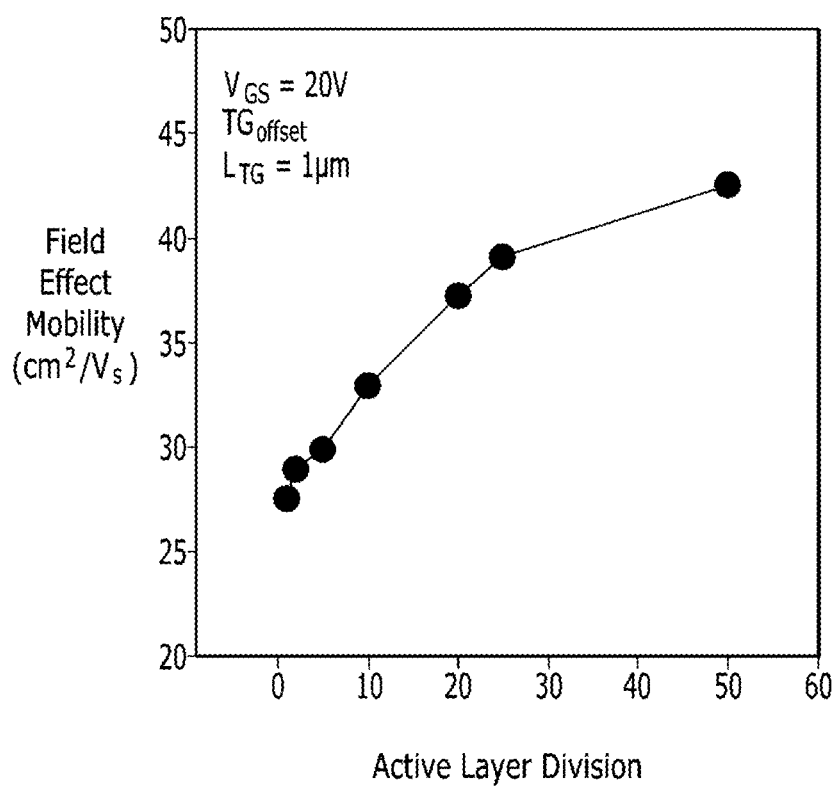
Figure 15B:
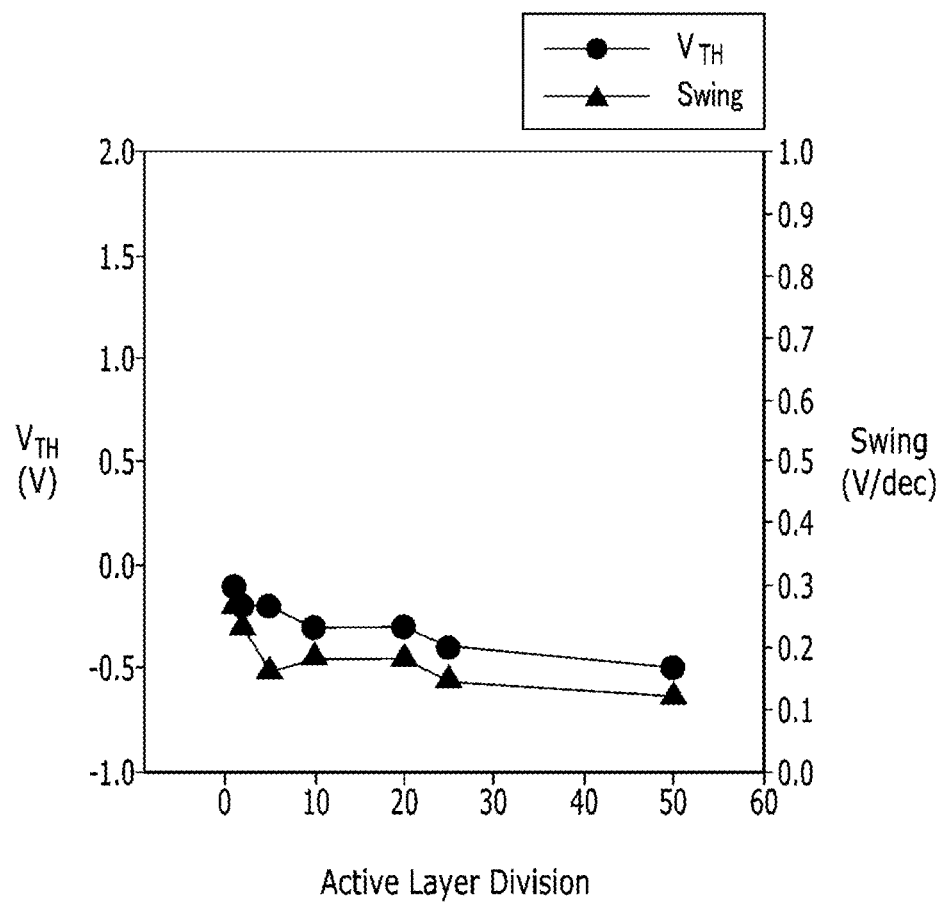
Figure 15C:
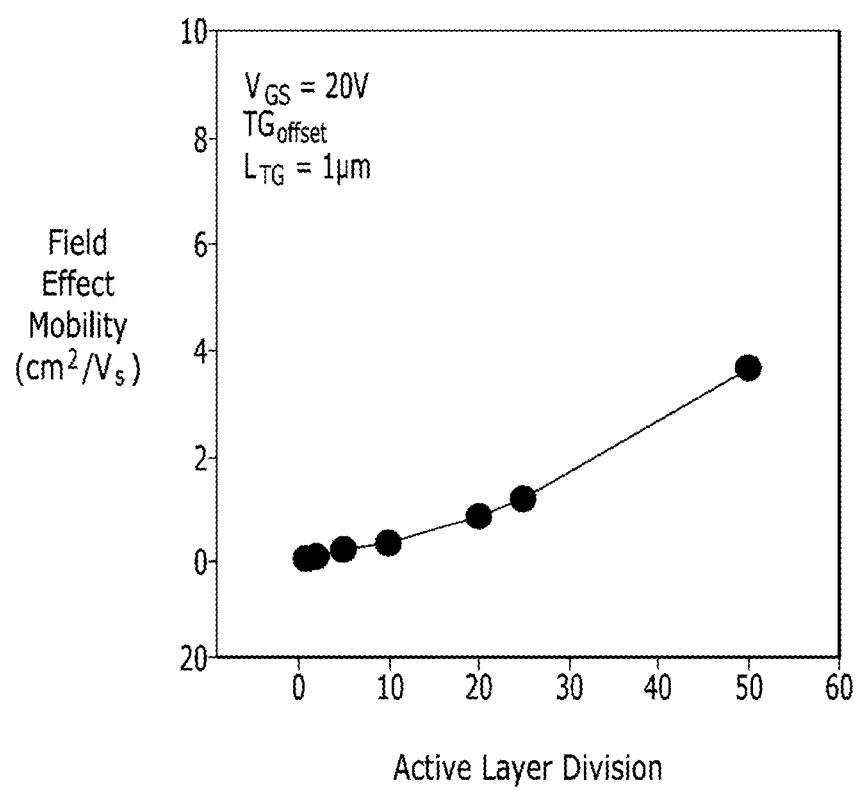
Figure 15D:
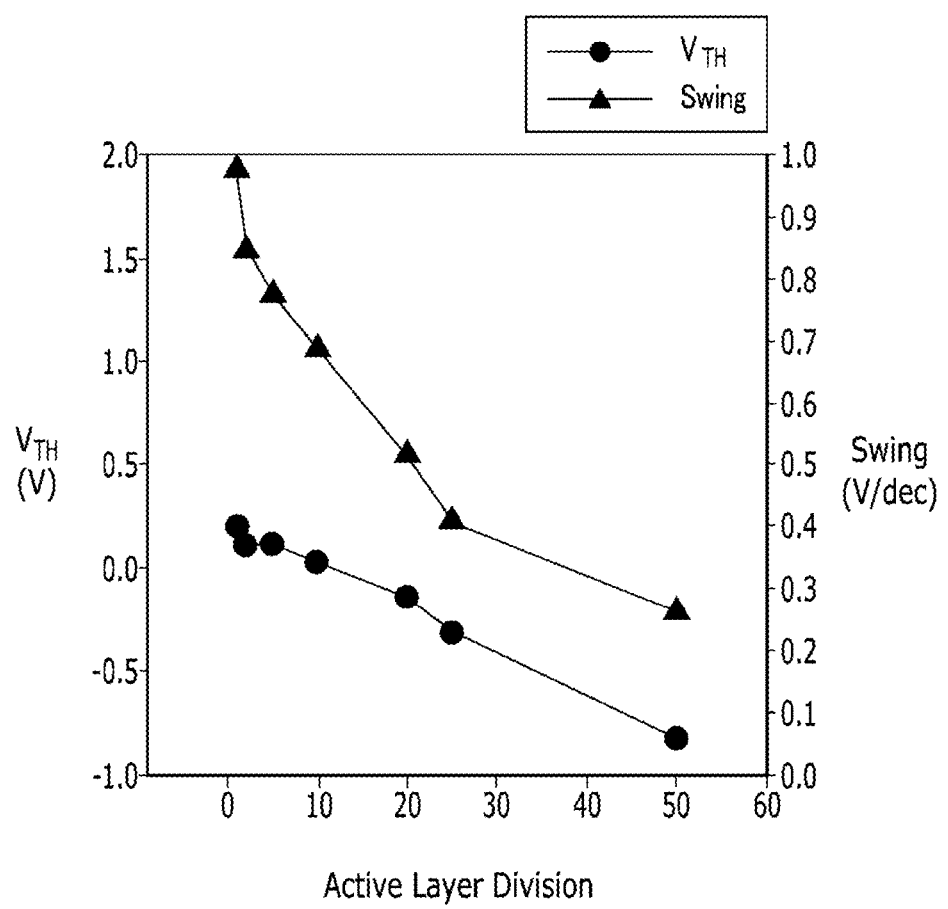
Figure 15E:
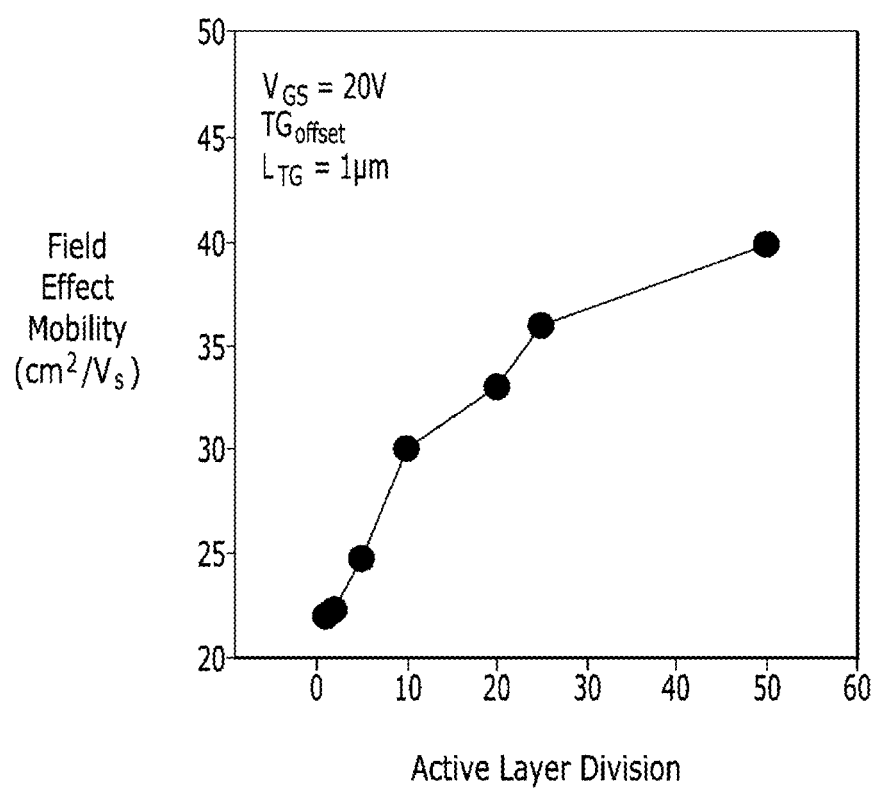
Figure 15F:
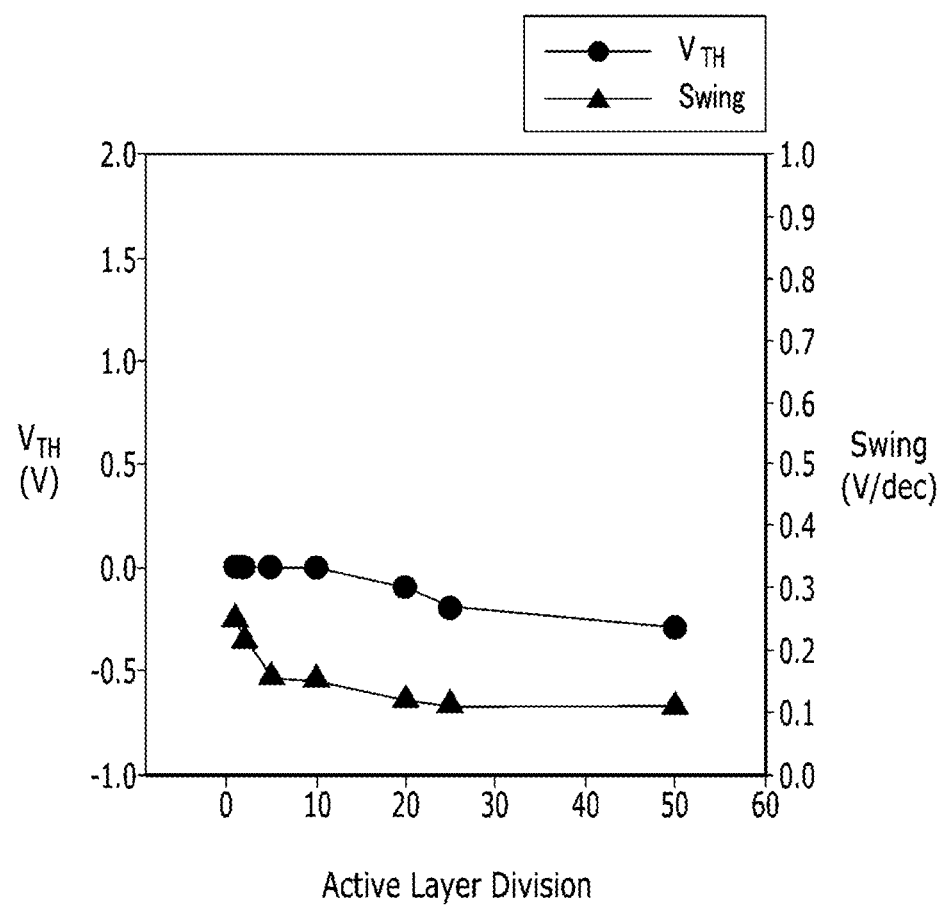

FIG. 11A shows that one oxide semiconductor transistor is inserted into an LCD panel, and shows an electrical connection between first and second gate electrodes and a driver line. FIG. 12B shows that two oxide semiconductor transistors are inserted into an AMOLED, and a first gate electrode and a second gate electrode are connected with a driver line in a switching transistor and a first gate electrode and a second gate electrode are electrically connected with another line of the switching transistor in a driving transistor. This, the oxide semiconductor transistor can be provided as a corresponding transistor.

Hereinafter, an electrical characteristic of the structure shown in FIG. 9A to 9D, and FIGS. 10A and 10B of the oxide semiconductor transistor for the display element according to another exemplary embodiment of the present invention will be described in more detail.

FIG. 12A to 12F illustrates transfer curves and output curves of a dual-gate electrode of the oxide semiconductor transistor 100 where island patterns are formed according to the exemplary embodiment of FIG. 8A to 8D, and respectively show measurement results when the second gate electrode is connected with a ground (i.e., 0 V) (i.e., a bottom sweep) or the first gate electrode 104 is connected with a ground (i.e., 0 V) (i.e., a top sweep) and the dual gate electrode is electrically connected (i.e., a dual sweep). Referring to FIG. 13A to 13F, it can be observed that a maximum peak of a current flowing to the drain electrode 114 is increased as in the single gate electrode structure of FIG. 5A to FIG. 7F. That is, as the number of island patterns is increased, a real width of the island pattern is decreased, thereby improving an electrical characteristic.

FIG. 13A to 13F shows graphs illustrating mobility, a threshold voltage, and a swing value according to the number of island patterns in the transfer curve of the bottom sweep, the top sweep, and the dual sweep. Compared to the single gate electrode structure, uniformity is increased, and mobility is increased as the number of island patterns is increased as in the single gate electrode structure.

FIG. 14A to 14F, and FIG. 15A to 15F are measurement graphs of transfer curves and output curves of a bottom sweep, a top sweep, and a dual sweep of an offset dual gate electrode of the oxide semiconductor transistor 100 where the island patterns are formed according to the exemplary embodiment of FIG. 9A to 9D of the present invention. It can also be observed than the electrical characteristic can be improved as the number of island patterns is increased, that is, as the real width of each island pattern is reduced in the offset dual gate electrode structure.

FIG. 15A to 15F shows graphs mobility, threshold voltages, and swing values in transfer curves of the bottom sweep, the top sweep, and the dual sweep of FIG. 14A to 14F according to the number of island patterns. It can be observed that the offset dual gate electrode structure also provide excellent uniformity, and mobility is increased as the number of island patterns is increased as in the single gate electrode structure.

Figure 16A:
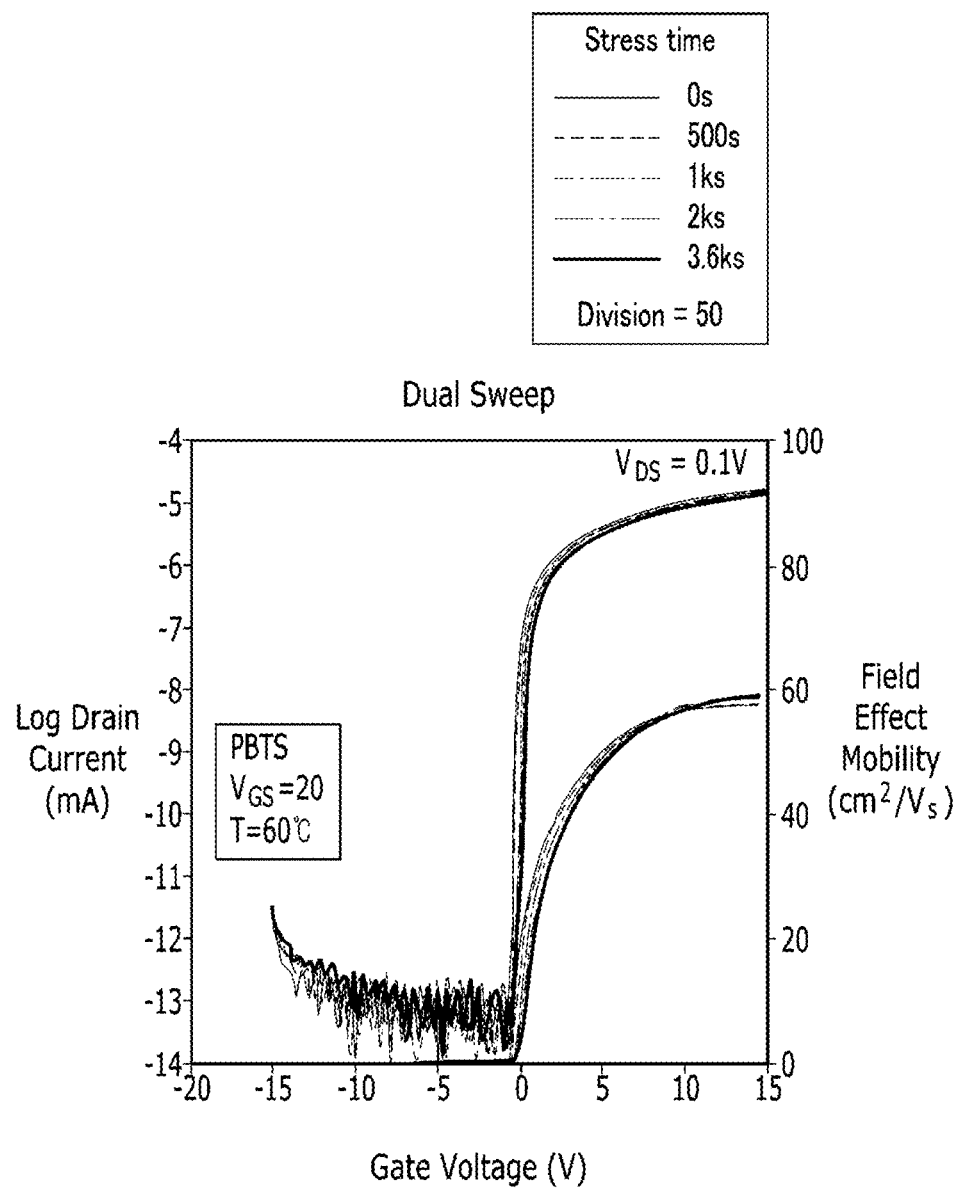
FIG. 16A and FIG. 16B show graphs that respectively illustrate electrical characteristics of the oxide semiconductor transistor according to the other exemplary embodiment when a positive voltage (e.g., +20 V) and a temperature of 60° C. are applied and when a drain current (100 μA) and a temperature of 60° C. are applied.
Figure 16B:
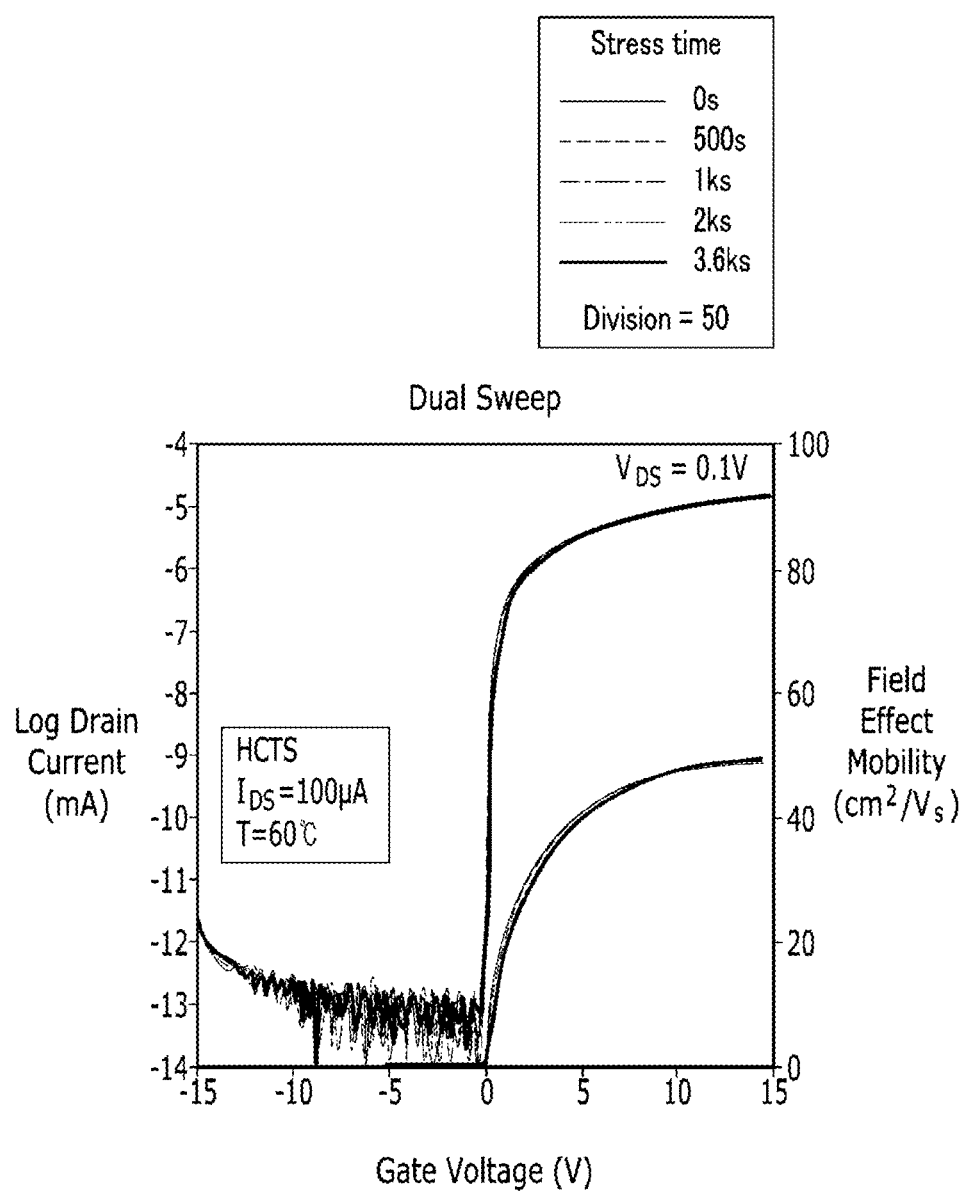

FIG. 16A and 16B shows graphs illustrating electrical characteristics of dual sweeps with application of a positive voltage (e.g., +20 V) and a drain current (IDS=100 µm) at a chuck temperature of 60° C., respectively, according to the exemplary embodiment of FIG. 8A to 8D. It can be observed that reliability according to voltage and current is very stable even at a high temperature. That is, not only mobility but also excellent reliability can be provided by using the transistor where the island patterns are formed.

Hereinafter, a method for manufacturing the oxide semiconductor transistor illustrated in FIGS. 3A and 3B, and FIGS. 10A and 10B according to the exemplary embodiment of the present invention will be described.

In S302, the first gate electrode 104 is formed on the substrate 102, and the first gate electrode 104 can be formed by depositing a gate electrode on the substrate 102, forming a photoresist pattern, and then selectively etching, i.e., patterning, the gate electrode 104 using the photoresist pattern as a mask.

In S304, the gate insulating layer 106, the oxide semiconductor layer 108, and the etch stopper layer 111 are sequentially deposited on the first gate electrode 104.

In S306, an island pattern is formed in the etch stopper layer 111 through dry-etching using $NF_3$ plasma.

In S308, patterns are formed by etching the oxide semiconductor layer 108 and the gate insulating layer 106. In this case, the oxide semiconductor layer 108 may have an island pattern structure using the same mask as that of the etch stopper layer 111.

In S310, the source electrode 112 and the drain electrode 114 are formed on the gate insulating layer 106, the oxide semiconductor layer 108, and the etch stopper layer 111.

In S312, the passivation layer 116 is formed on the source electrode 112 and the drain electrode 114.

In S314, the pixel electrodes 118 and 119 are formed on the passivation layer 116.

In S316, the passivation layer is formed after forming the pixel electrodes 118 and 119.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An oxide semiconductor transistor comprising:
a substrate;
a first gate electrode disposed on the substrate;
a gate insulating layer disposed on the substrate and the first gate electrode;
an oxide semiconductor layer disposed on the gate insulating layer;
an etch stopper layer disposed on the oxide semiconductor layer; and
a source electrode and a drain electrode disposed on the oxide semiconductor layer and the etch stopper layer and spaced apart from each other,
wherein the oxide semiconductor layer comprises a plurality of oxide semiconductor island patterns that are spaced apart from each other in a direction that is perpendicular to a width direction of the first gate electrode,
wherein the etch stopper layer comprises a plurality of etch stopper island patterns that are spaced apart from each other in the direction perpendicular to the width direction of the first gate electrode,
wherein each of the plurality of etch stopper island patterns is disposed on a corresponding oxide semiconductor island pattern, such that each of the plurality of oxide semiconductor island patterns is covered with a corresponding etch stopper island pattern,
wherein the source electrode and the drain electrode overlap portions of all the plurality of island patterns of the oxide semiconductor layer and the etch stopper layer,
wherein a space distance between adjacent etch stopper island patterns of the plurality of etch stopper island patterns is about 1 µm to about 5 µm, and a total width of the plurality of etch stopper island patterns and a sum of space distance between all adjacent etch stopper island patterns of the plurality of etch stopper island patterns is about 100 µm to about 110 µm,
wherein a width of the each of the plurality of oxide semiconductor island patterns is about 1 µm to about 4 µm, and a width of the each of the plurality of etch stopper island patterns is about 1 µm to about 4 µm,
wherein a number of the plurality of oxide semiconductor island patterns is about 20 to about 50, and a number of the plurality of etch stopper island patterns is about 20 to about 50.

2. The oxide semiconductor transistor of claim 1, wherein a width of the etch stopper island pattern of the etch stopper layer is smaller than or equal to a width of the oxide semiconductor island pattern of the oxide semiconductor layer.

3. The oxide semiconductor transistor of claim 1, wherein the plurality of oxide semiconductor island patterns are parallel with each other, and the plurality of etch stopper island patterns are parallel to each other.

4. The oxide semiconductor transistor of claim 1, wherein the etch stopper layer comprises at least one of $SiO_2$, $Al_2O_3$, and $SiN_X$.

5. The oxide semiconductor transistor of claim 1, wherein the oxide semiconductor layer comprises at least one of an indium gallium zinc oxide (IGZO), a zinc oxide (ZnO), an indium zinc oxide (IZO), an indium tin oxide (ITO), a zinc tin oxide (ZTO), a gallium zinc oxide (GZO), a hafnium indium zinc oxide (HIZO), a zinc indium tin oxide (ZITO), and an aluminum zinc tin oxide (AZTO).

6. The oxide semiconductor transistor of claim 1, further comprising a passivation layer that covers the source electrode, the drain electrode, and the etch stopper layer, and a second gate electrode disposed on the passivation layer.

7. The oxide semiconductor transistor of claim 6, wherein the first gate electrode and the second gate electrode are electrically connected with a via hole.

8. The oxide semiconductor transistor of claim 6, wherein the first gate electrode and the second gate electrode are overlapped with each other.

9. The oxide semiconductor transistor of claim 6, wherein a cross-sectional width of the second gate electrode is shorter than a distance between the source electrode and the drain electrode.

10. The oxide semiconductor transistor of claim 9, wherein a distance between the second gate electrode and the source electrode is about 0.5 µm to about 5 µm, and a distance between the second gate electrode and the drain electrode is about 0.5 µm to about 5 µm.

11. An oxide semiconductor transistor comprising:
a substrate;
an insulating layer disposed on the substrate;
an oxide semiconductor layer disposed on the insulating layer;
an etch stopper layer disposed on the oxide semiconductor layer;
a source electrode and a drain electrode disposed on the oxide semiconductor layer and the etch stopper layer and disposed apart from each other;

a gate insulating layer that covers the source electrode, the drain electrode, and the etch stopper layer; and a gate electrode disposed on the gate insulating layer, wherein the oxide semiconductor layer comprises a plurality of oxide semiconductor island patterns that are spaced apart from each other in a direction that is perpendicular to a width direction of the gate electrode, wherein the etch stopper layer comprises a plurality of etch stopper island patterns that are spaced apart from each other in the direction perpendicular to the width direction of the first gate electrode, wherein each of the plurality of etch stopper island patterns is disposed on a corresponding oxide semiconductor island pattern, such that each of the plurality of oxide semiconductor island patterns is covered with a corresponding etch stopper island pattern, wherein the source electrode and the drain electrode overlap portions of all the plurality of island patterns of the oxide semiconductor layer and the etch stopper layer, wherein a space distance between adjacent etch stopper island patterns of the plurality of etch stopper island patterns is about 1 μm to about 5 μm, and a total width of the plurality of etch stopper island patterns and a sum of space distance between all adjacent etch stopper island patterns of the plurality of etch stopper island patterns is about 100 μm to about 110 μm, wherein a width of the each of the plurality of oxide semiconductor island patterns is about 1 μm to about 4 μm, and a width of the each of the plurality of etch stopper island patterns is about 1 μm to about 4 μm, wherein a number of the plurality of oxide semiconductor island patterns is about 20 to about 50, and a number of the plurality of etch stopper island patterns is about 20 to about 50.

12. The oxide semiconductor transistor of claim 11, wherein a cross-sectional width of the gate electrode is shorter than a distance between the source electrode and the drain electrode.

13. The oxide semiconductor transistor of claim 11, wherein the plurality of oxide semiconductor island patterns are parallel with each other, and the plurality of etch stopper island patterns are parallel with each other.

* * * * *